United States Patent [19]

Kume et al.

[11] 4,290,131
[45] Sep. 15, 1981

[54] ELECTRONIC TIMEPIECE

[75] Inventors: Kazunari Kume; Hideshi Ohno, both of Tokorozawa, Japan

[73] Assignee: Citizen Watch Company Limited, Tokyo, Japan

[21] Appl. No.: 26,971

[22] Filed: Apr. 4, 1979

[30] Foreign Application Priority Data

Apr. 6, 1978 [JP] Japan .............................. 53-040682
May 19, 1978 [JP] Japan .............................. 53-059657

[51] Int. Cl.³ ............................................ G04B 25/00
[52] U.S. Cl. ........................................ 368/71; 368/76;
368/82; 368/83; 368/84; 368/239; 368/241;
368/242; 368/228
[58] Field of Search ............... 58/23 R, 23 A, 23 AC,
58/23 V, 23 D, 24 R, 33, 50 R, 4 A; 307/106,
132 R, 141; 235/96, 92; 318/600-602; 206/38,
14; 340/339, 309, 338; 368/71, 76, 82, 83, 84,
239, 241, 242, 228

[56] References Cited

U.S. PATENT DOCUMENTS

| | | | |
|---|---|---|---|
| 3,756,016 | 9/1973 | Kimura et al. | 58/50 R |
| 3,759,030 | 9/1973 | Wakabayashi | 58/50 R |
| 3,760,581 | 9/1973 | Wakabayashi | 58/50 R X |
| 3,879,932 | 4/1975 | Kimura et al. | 58/50 R |
| 3,911,665 | 10/1975 | van Berkum | 58/4 A |

Primary Examiner—Ulysses Weldon
Attorney, Agent, or Firm—Jordan & Hamburg

[57] ABSTRACT

An electronic timepiece having time indicating hands driven by a motor through a gear train, and having an analog-to-digital conversion system for time data comprising code disks rotated by the wheel train to provide hours and minutes information in digital coded form, together with means for converting this encoded digital information into digital signals representing hours and minutes information corresponding to the time information indicated by the hands and synchronized with the time indicated by the seconds hand of the timepiece.

16 Claims, 21 Drawing Figures

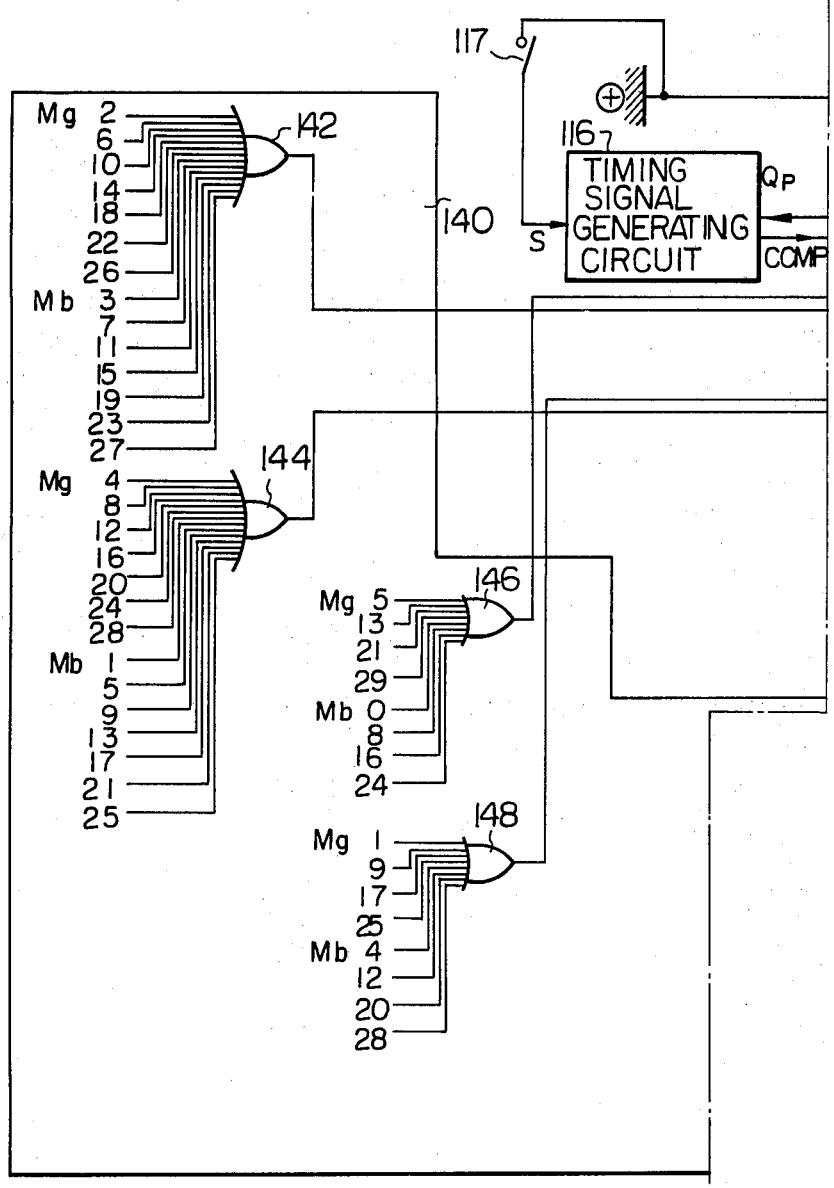

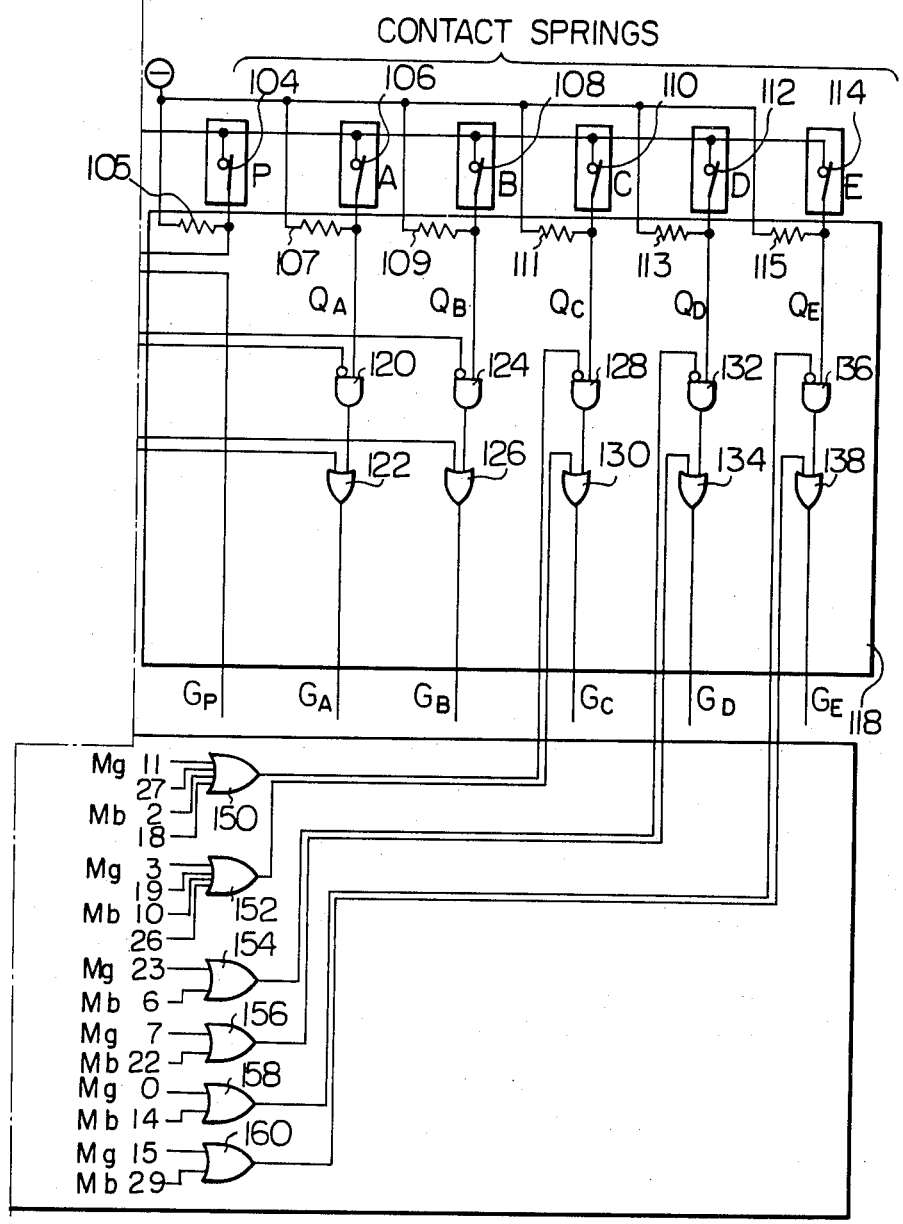

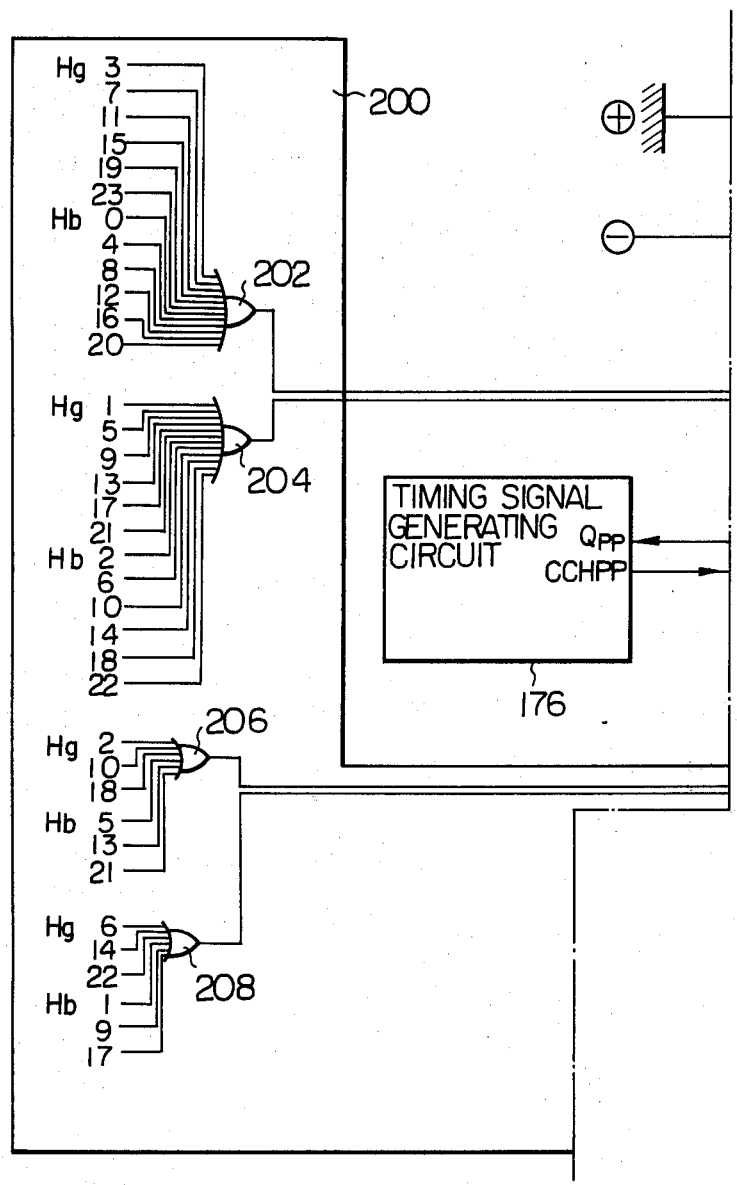

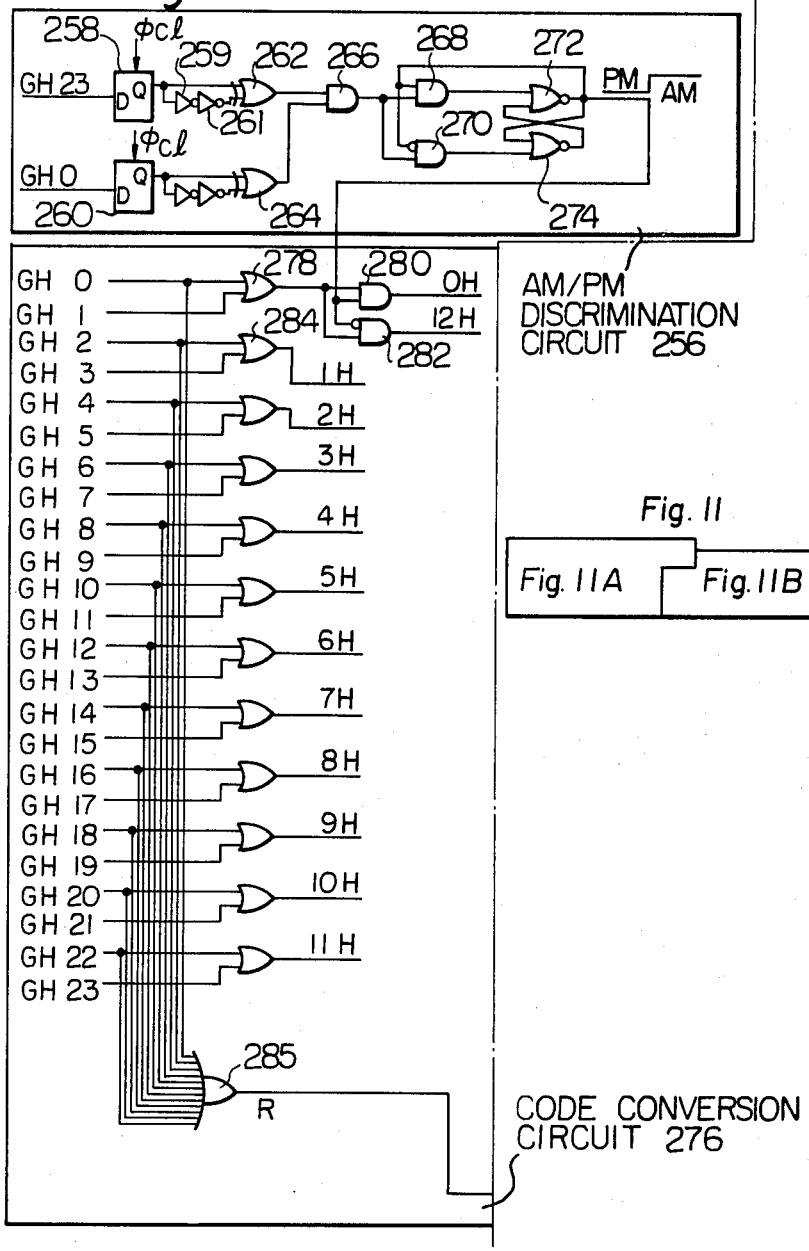

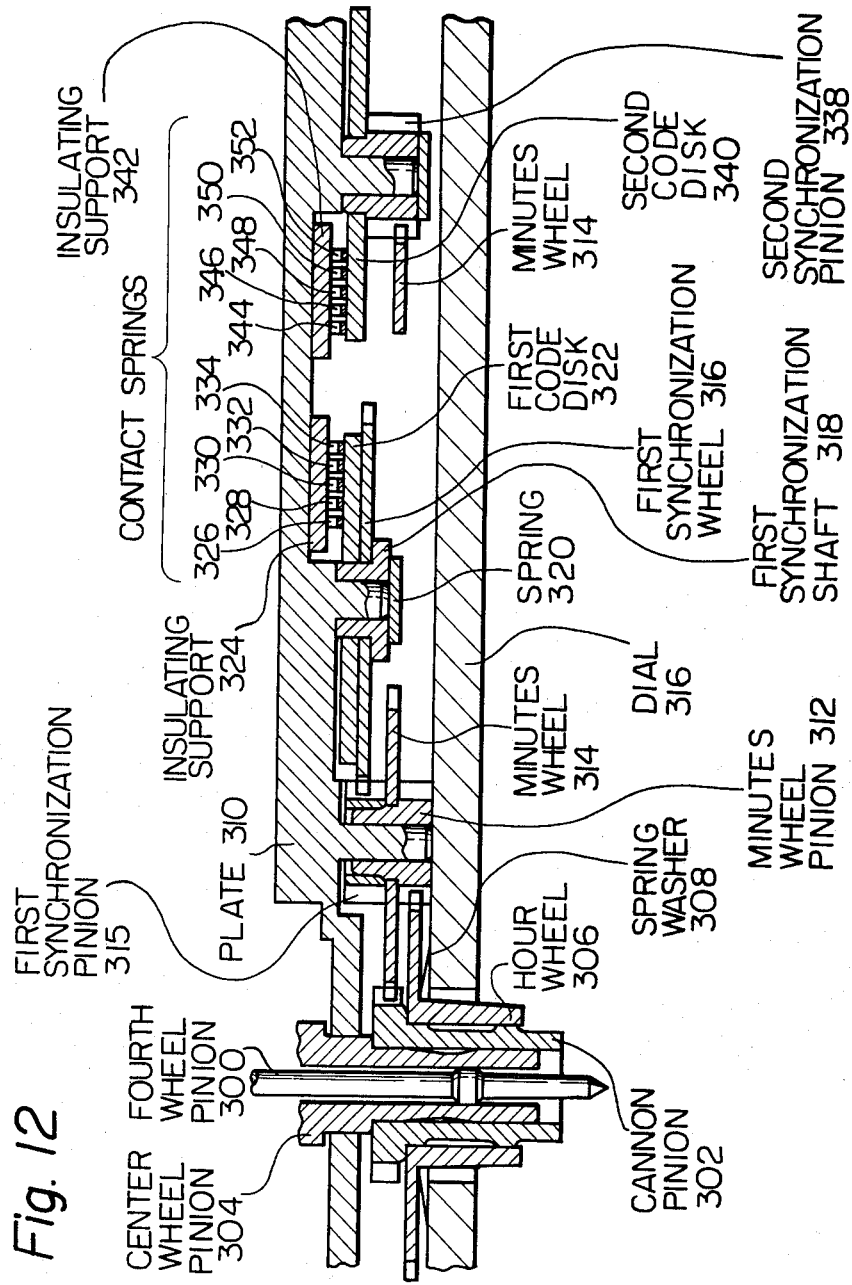

FIRST CODE DISK
322

322

SECOND CODE DISK
340

340

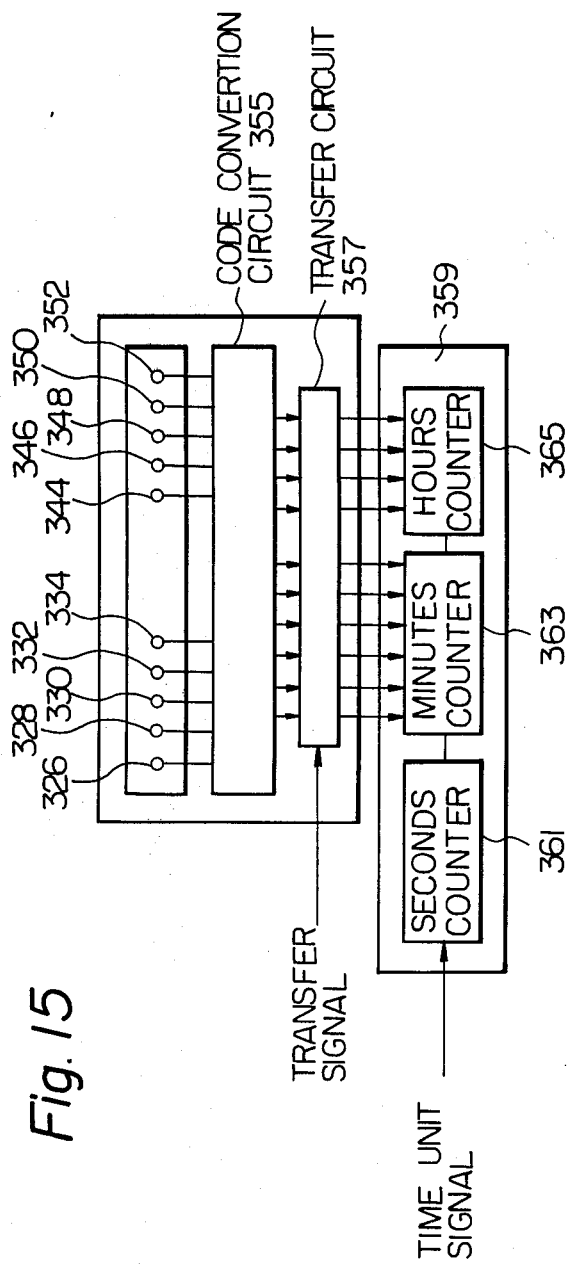

ELECTRONIC TIMEPIECE

This invention relates to an electronic timepiece having an analog-to-digital time data conversion system whereby time data corresponding to that displayed by time indicating hands is provided in the form of digital electronic signals.

Up until the present, no electronic timepiece has been placed upon the market which will both display time information in analog form (e.g. by means of time indicating hands) and will also convert this analog time information into digital electronic signals by means of an analog-to-digital conversion system. Such an electronic timepiece would provide various significant advantages, since it would become possible to process the time information by electronic means in a variety of ways. For example, with a conventional type of electronic timepiece of analog type which has an alarm function, it is difficult to precisely detect the moment of coincidence between the current time (indicated by the hands) and a preset alarm time. This is due to the fact that it is generally necessary to provide some electrical switch means which is actuated in a mechanical manner by the wheel train of the timepiece in order to detect the alarm time coincidence. Due to such problems as manufacturing tolerances, backlash in the wheel train, etc., it is extremely difficult to perform such detection with a high degree of precision, without increasing the cost of manufacture, or size of the timepiece, to an unacceptable extent. If the current time information is available in digital electronic signal form, however, then these problems can be easily solved. For example, the preset alarm time can be stored in an electronic storage circuit, and compared electronically with the digital time information. When alarm time coincidence is detected, an electrical signal can be generated thereby with a high level of accuracy, to actuate an audible alarm signal. Processing time information in this way can be done without increasing the size of the timepiece, and with very little increase in mechanical complexity, as will be shown hereinafter.

Another example of the advantages of processing time information electronically rather than mechanically is the case of an electronic timepiece which displays time information both in analog form and in digital form. Such timepiece have already been made available. However, in previous designs of such timepiece, the time information which is displayed digitally is generated by an electronic counter system. It is therefore necessary to provide means for ensuring that the time displayed by the hands of the timepiece and that indicated by the digital display are kept in synchronism when the time information is corrected or when a new battery is inserted in the timepiece. This can result in inconvenience to the timepiece user. If the analog time information is converted into digital signals, however, then such problems cannot arise, since the analog and digital time information displays will always be in synchronism.

The above are only two examples of the advantage to be obtained by providing an analog-to-digital time data conversion system in an electronic timepiece, thereby providing time information in a form in which it can be processed electronically. Various other applications of such a timepiece can be envisaged, and it will be appreciated that the present invention has wide-ranging possibilities.

It is therefore an object of the present invention to provide an electronic timepiece having means whereby time information displayed in an analog manner is also provided in the form of digital electrical signals, to be processed by electronic means.

Further objects, features and advantages of the present invention will be made more apparent from the following description of a preferred embodiment, when taken in conjunction with the attached drawings, whose scope is given by the appended claims.

In the drawings:

FIG. 6 is a circuit diagram of a first code processing circuit of the embodiment of FIG. 1, for providing minutes information in encoded from;

Figure 1:
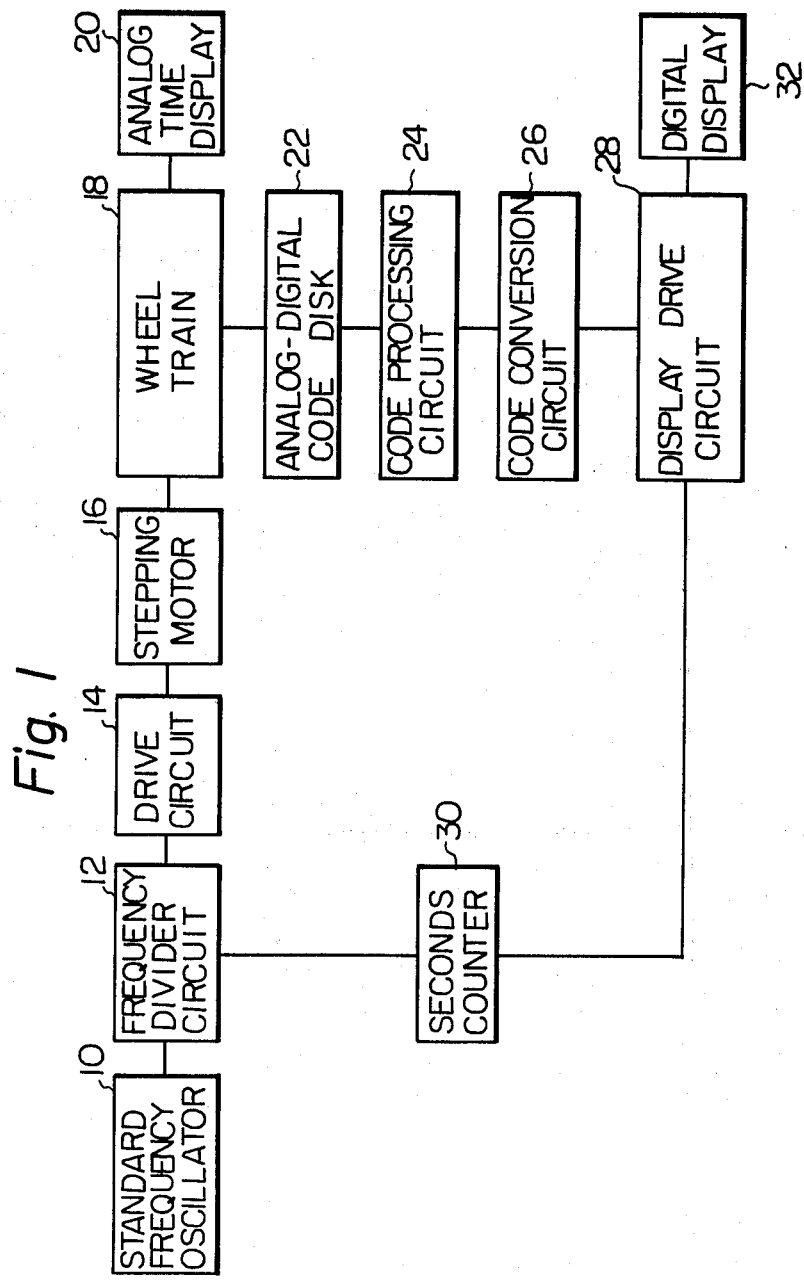
FIG. 1 is a general block diagram of an embodiment of an electronic timepiece having an analog-to-digital conversion system according to the present invention.
Figure 8:
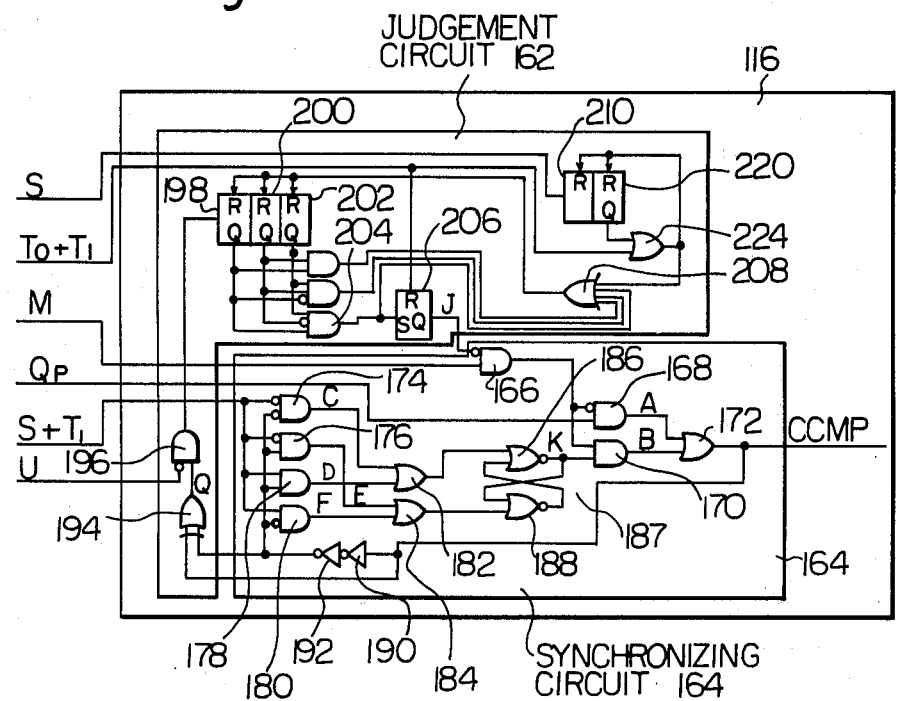
FIG. 8 is a circuit diagram of a timing signal generation section of the circuit of FIG. 6.
Figure 9:
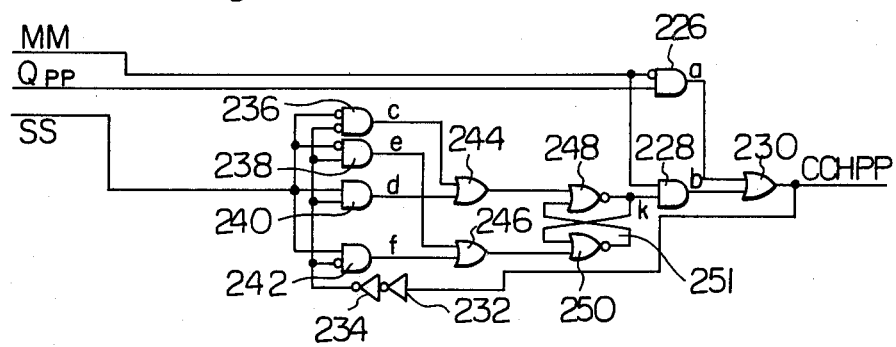
FIG. 9 is a circuit diagram of a timing signal generation section of the circuit of FIG. 7.
Figure 10A:
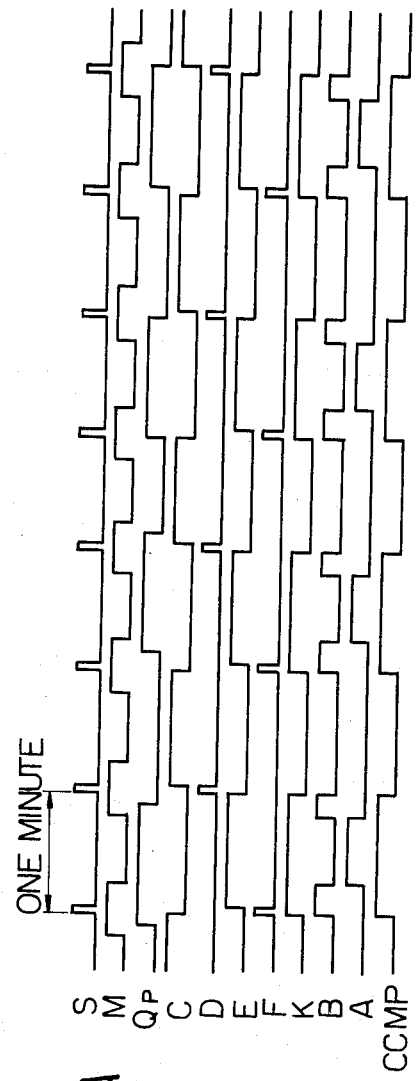
Figure 10B:
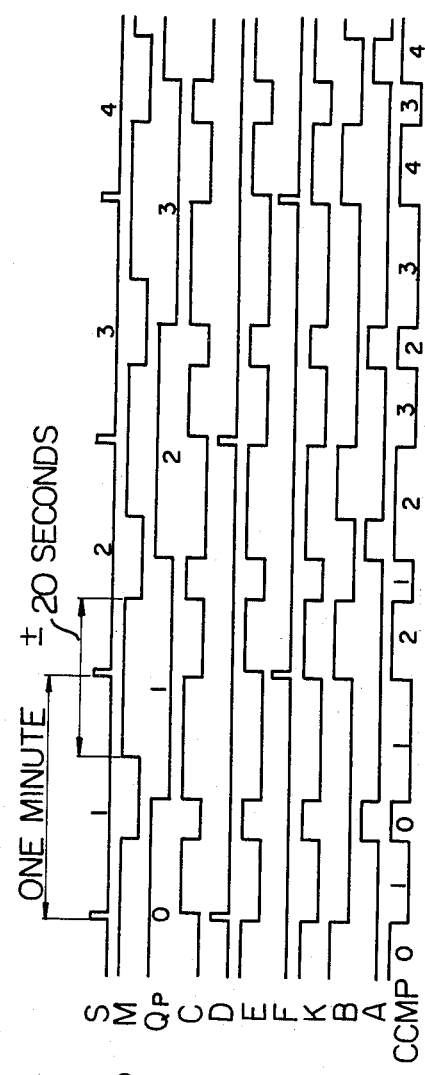
Figures 10C, 10D:
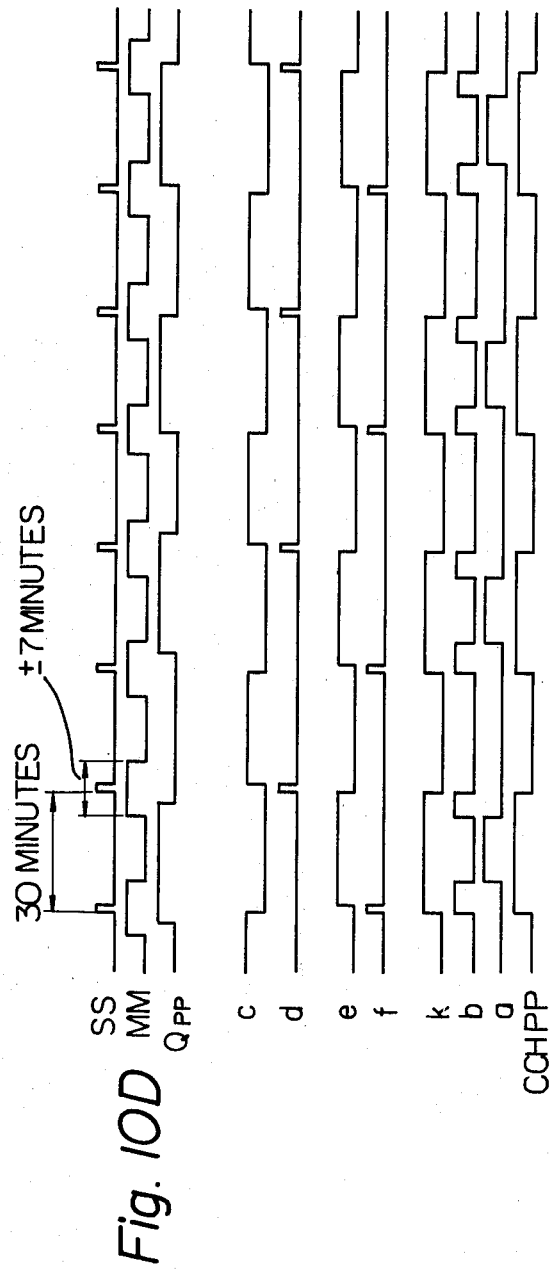
Figure 11B:
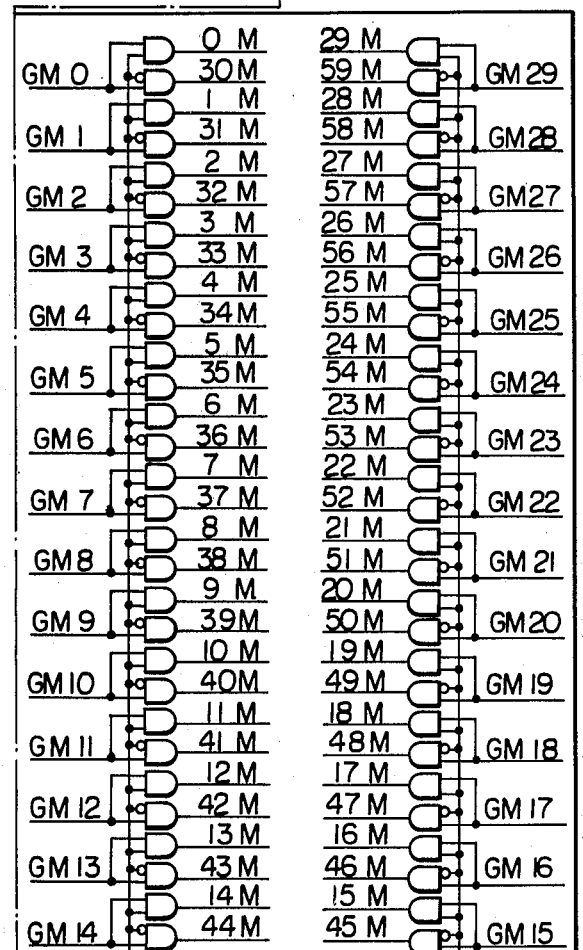
Figure 13A:
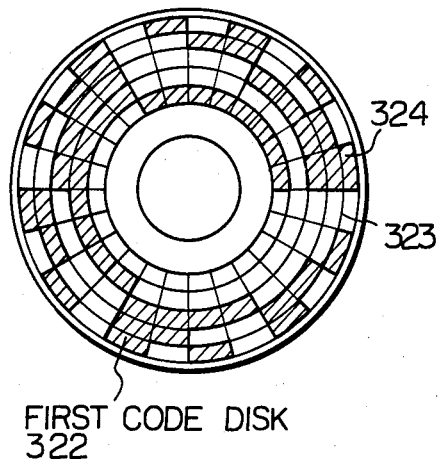
Figure 14A:
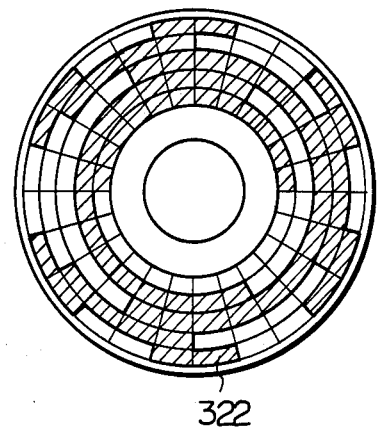
Figure 13B:
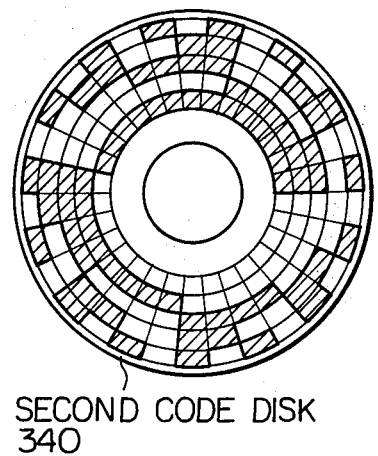
Figure 14B:
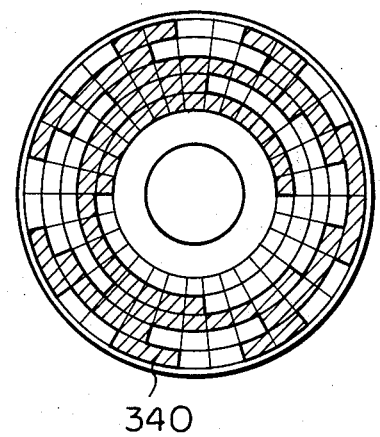

FIGS. 10A, 10B, and 10C are waveform diagrams for the circuit of FIG. 8;

FIG. 10D is a waveform diagram for the circuit of FIG. 9;

FIG. 11 is a partial circuit diagram of a code conversion circuit of the timepiece of FIG. 1;

FIG. 12 is a partial cross-sectional view in elevation of a second embodiment of an electronic timepiece having an analog-to-digital time data conversion system according to the present invention;

FIGS. 13A and 14A are examples of code disks for the second embodiment, to provide encoded hours information;

FIGS. 13B and 14B are examples of code disks for the second embodiment, to provide encoded minutes information; and FIG. 15 is a block diagram example of circuits for receiving digital code data from the analog-to-digital conversion means of the second embodiment.

Referring now to the diagrams, FIG. 1 shows a general block diagram of a first preferred embodiment of an electronic timepiece having an analog-to-digital conversion system according to the present invention. Reference numeral 10 indicates a quartz crystal controlled oscillator circuit which produces a standard frequency signal of relatively high frequency, such as 32768 Hz. This standard frequency signal is applied to a frequency divider circuit 12, which produces a time units signal having a frequency of 1 Hz. The time unit signal is applied to a drive circuit 14, which produces drive pulses of suitable waveform which are applied to a stepping motor 16. Stepping motor 16 is coupled to a wheel train 18, to drive the seconds hand, minutes hand and hours hand of an analog time display 20.

Reference numeral 22 denotes analog-to-digital code conversion means, comprising two coded disks which are coupled to wheel train 18, to be rotated thereby at speeds of one revolution in 30 minutes and one revolution in 12 hours respectively, and means for generating digital code signals in accordance with the positions of these code disks.

Numeral 24 denotes a code processing circuit, which serves to synchronize the transitions between successive states of the digital code signals with the movement of the seconds hand of the timepiece. The synchronized code signals are then applied to a code conversion circuit 26, which generates digital signals indicating hours, minutes, and AM/PM information. These digital signals are than applied to a display decoder/driver circuit 28, which produces display drive signals to be applied to a digital display device 32. Numeral 30 denotes a seconds counter, which receives a signal of frequency 1 Hz from frequency divider circuit 12, and produces signals indicating seconds time information which are applied to the display decoder/driver circuit 28. Digital display 32 thus displays seconds, minutes and hours of time information in digital form.

Referring now to FIGS. 2A and 2B, partial cross-sectional views in elevation are given therein of the timepiece of FIG. 1, showing the relationship between wheel train 18 and analog-digital code conversion means 22 of FIG. 1. Wheel train 18 comprises a sixth wheel and pinion (not shown) which consists of a wheel that meshes with a pinion on the shaft of stepping motor 16, and a pinion; a fifth wheel and pinion (not shown) consisting of a wheel meshing with the pinion of the sixth wheel and a pinion; a fourth wheel and pinion consisting of a wheel meshing with the pinion of the fifth wheel, and a pinion. The fourth wheel and pinion is fixedly attached to a shaft which is partially shown in FIG. 2A denoted by reference numeral 36. Shaft 36 is attached to the seconds hand analog time display 20 of FIG. 1. Wheel train 18 further comprises a third wheel and pinion (not shown) consisting of a wheel meshing with the pinion of the fourth wheel and a pinion for speed reduction;, a center wheel and pinion consisting of a center wheel 38 meshing with the pinion of the third wheel a center wheel pinion 40 which is in frictional contact with center wheel 38, a shaft 42 which is integrated with center wheel pinion 40, shaft 42 being attached to a minutes hand of the analog time display 20 in FIG. 1; a minutes wheel 46 meshing with the center wheel pinion 40 and attached to a pinion 48; an hours wheel 50 meshing with the minutes wheel pinion 48 and attached to a shaft 52 which is fixed to an hours hand of analog time display 20; a second synchronization wheel 54 meshing with hours wheel 50 and attached to a shaft 56; a second code disk 72, forming part of analog-to-digital code conversion means 22 of FIG. 1, and fixed to the shaft 56 to be rotated thereby; a synchronization transmission pinion 58 meshing with the minutes wheel 46 and fixed to a synchronization transmission wheel 60; a first synchronization pinion 63 meshing with the synchronization transmission wheel 60; a first code disk 62 fixed to the first synchronization pinion 63 to be rotated thereby, and forming part of analog-to-digital code conversion means 22 of FIG. 1; an intermediate wheel (not shown) meshing with the first synchronization pinion 63; a setting wheel (not shown) meshing with the intermediate wheel; a clutch wheel (not shown) meshing with the setting wheel; and a winding stem 64 engaging with the clutch wheel. The manner of combining the setting wheel, clutch wheel and winding stem 64 are similar to those of a conventional electronic timepiece, and will not be described hereinafter.

The wheel train 18 is supported by a plate 66, a wheel train bridge (not shown), a minutes wheel spring 68, a winding stem retainer, and a dial plate 69, such that the moving parts can move freely.

Numeral 74 indicates one of a set of contact springs which are held in sliding contact with a second code disk 72. Contact spring 74 and the other contact springs 76, 78, 80, 82 and 84 are shown in plan view in FIG. 3. The other end of each of contact springs 74 to 82 is connected to a terminal of code processing circuit 24. First code disk 62 also has a set of contact springs in sliding contact with its surface, with the other end of each of these contact springs being connected to code processing circuit 24.

The operation of the wheel train 18 is as follows. Stepping motor 16 is caused to rotate through one step per second in response to the drive signal applied from drive circuit 14. The rotational motion of the stepping motor 16 is transmitted to the sixth wheel and pinion, which transmits the rotational motion in turn to the fifth wheel and pinion, with a speed reduction. Further speed reduction is performed by being transmitted to the fourth wheel and pinion, which rotates at one revolution per minute. Thus, the seconds hand, attached to shaft 36, is rotated at one revolution per minute. Similarly, the fourth wheel and pinion, in conjunction with the third wheel and pinion, center wheel 38, and cannon pinion 44 perform further speed reduction, causing shaft 42 fixed to minutes wheel 46 and the minutes hand to be rotated through one revolution per hour. Further speed reduction is performed by center wheel 38 and pinion 40, in conjunction with cannon pinion 44 and hours wheel 50, so that shaft 52, attached to hours wheel 50 and the hours hand, is rotated through one revolution in 12 hours. Hours, minutes and seconds information is thus displayed by analog time display 20.

Second synchronization wheel 54, which meshes with hours wheel 50, is thereby caused to rotate through one revolution in 12 hours, i.e. second code disk 72 rotates through one revolution in 12 hours.

The number of teeth on synchronization transmission wheel 60, and on first synchronization pinion 63 is established such that the first synchronization pinion (and hence, the first code disk 62) rotates at one revolution in every 30 minutes, since synchronization transmission pinion 58 meshes with minutes wheel 46.

The intermediate wheel, setting wheel, clutch wheel, and winding stem 64, are used when setting of the time indicated by the minutes hand and hours hand is performed. When winding stem 64 is rotated, resultant turning force is transmitted to the clutch wheel, setting wheel, intermediate wheel, synchronization transmission pinion 58, and minutes wheel 46, in that order. Hours wheel 50, which meshes with minutes wheel pinion 48 is thus also rotated. Correction of the time indicated by the hours and minutes hands can thus be performed by turning the winding stem 64.

First synchronization pinion 63, to which first code disk 62 is attached, is coupled to minutes wheel 46 through synchronization transmission pinion 58 and synchronization transmission wheel 60. Thus, there is a fixed relationship betweem the movement of the minutes hand of the timepiece and the movement of first code disk 62. Similarly, second synchronization wheel 54, to which second code disk 72 is attached by shaft 56, meshes with hours wheel 50. Thus, there is also a fixed relationship between the movement of the hours hand of the timepiece and the movement of seocnd code disk 72.

Figure 2:
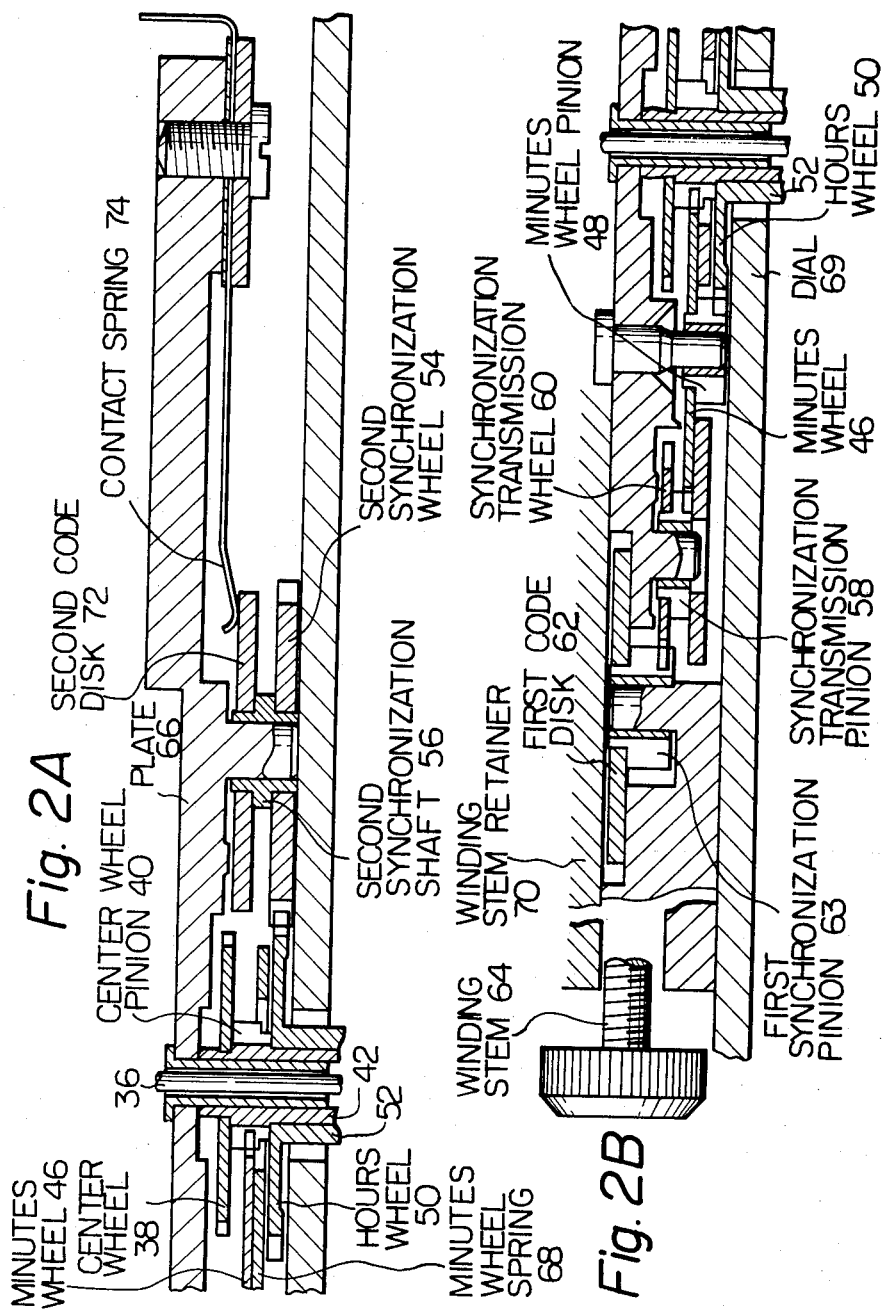
FIGS. 2A and 2B are partial cross-sectional diagrams in elevation of the electronic timepiece of FIG. 1.
Figure 4:
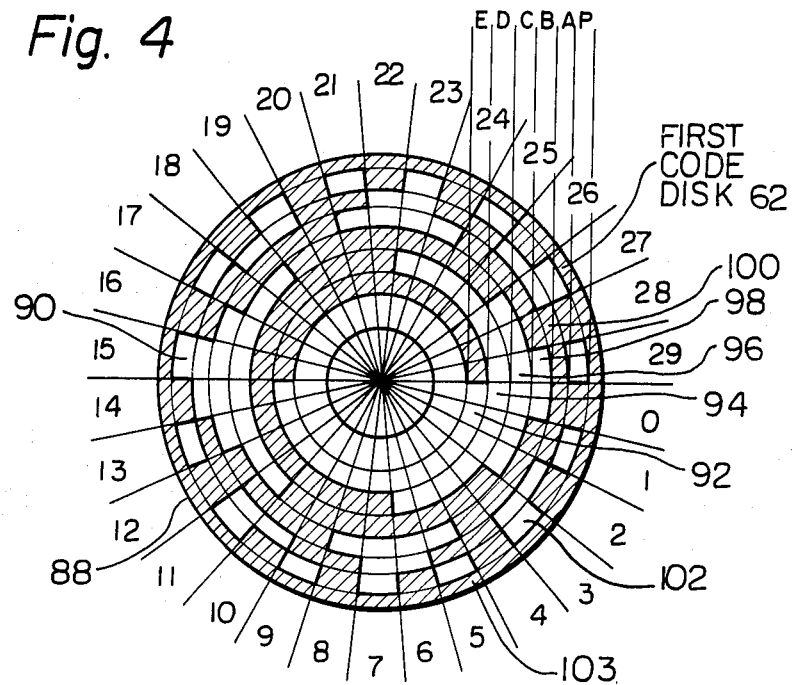
FIG. 4 is a plan view of a first code disk of the timepiece of FIG. 1, for providing minutes information.

Referring now to FIG. 4, the surface of first code disk 62 in sliding contact with a set of contact springs is shown therein. First code disk 62 is made of a non-conducting substrate, having a pattern of conducting areas formed on one of its surface and fixed thereto. Numeral 90 denotes an area of the code disk surface which is non-conductive, while numeral 88 denotes an area which has been made electrically conductive. The surface area is divided into a set of five concentric circular tracks, denoted by numerals 92, 94, 96, 98, 100 and 102, which are coded by being divided into conductive and non-conductive segments, and a peripheral track 103 which provides electrical contact between all of the electrically conductive areas of the surface, for connecting all of these areas to the ground potential. Plate 66 shown in FIG. 2 is also at ground potential. The conductive and non-conductive areas of tracks 92, 94, 96, 98 and 100 are arranged radially into 30 sectors. One of each of the contact springs referred to previously (not shown in FIG. 4) is in sliding contact with one of the tracks 92, 94, 96, 98 and 100, so that as first code disk 62 rotates, a digital code signal is generated from each of these contact springs. Each of these digital code signals constitutes one bit of a multi-bit digital code. The codes corresponding to tracks 92, 94, 96, 98, 100 and 102 are designated hereinafter as E, D, C, B, A and P respectively. In this embodiment, the timepiece power source is a 1.5 volt silver oxide battery whose positive terminal is connected to ground (i.e. to plate 66) and the state of the signal produced by a contact spring when it comes in contact with a conducting area of a code disk and thereby has +1.5 volt applied to it will be designated as the 1 (one) logic level, while the signal produced by a contact spring when it contacts a non-conducting area of first code disk 62 will be designated as the 0 (zero) logic level. It will be apparent that as first code disk 62 rotates, a total of 30 code combinations can be identified by the signals produced by the contact springs.

The codes P, A, B, C, D and E which result from the patterns on tracks 102, 100, 98, 96, 94 and 92 are shown in Table 1.

TABLE 1

| SECTOR | P | A | B | C | D | E |
|---|---|---|---|---|---|---|
| 0 | 1 | 1 | 0 | 0 | 0 | 0 |
| 1 | 0 | 1 | 1 | 0 | 0 | 0 |
| 2 | 1 | 0 | 1 | 0 | 0 | 0 |
| 3 | 0 | 0 | 1 | 1 | 0 | 0 |
| 4 | 1 | 1 | 1 | 1 | 0 | 0 |
| 5 | 0 | 1 | 0 | 1 | 0 | 0 |
| 6 | 1 | 0 | 0 | 1 | 0 | 0 |
| 7 | 0 | 0 | 0 | 1 | 1 | 0 |
| 8 | 1 | 1 | 0 | 1 | 1 | 0 |
| 9 | 0 | 1 | 1 | 1 | 1 | 0 |
| 10 | 1 | 0 | 1 | 1 | 1 | 0 |
| 11 | 0 | 0 | 1 | 0 | 1 | 0 |
| 12 | 1 | 1 | 1 | 0 | 1 | 0 |
| 13 | 0 | 1 | 0 | 0 | 1 | 0 |
| 14 | 1 | 0 | 0 | 0 | 1 | 0 |
| 15 | 0 | 0 | 0 | 0 | 1 | 1 |
| 16 | 1 | 1 | 0 | 0 | 1 | 1 |
| 17 | 0 | 1 | 1 | 0 | 1 | 1 |
| 18 | 1 | 0 | 1 | 0 | 1 | 1 |
| 19 | 0 | 0 | 1 | 1 | 1 | 1 |
| 20 | 1 | 1 | 1 | 1 | 1 | 1 |
| 21 | 0 | 1 | 0 | 1 | 1 | 1 |
| 22 | 1 | 0 | 0 | 1 | 1 | 1 |
| 23 | 0 | 0 | 0 | 1 | 0 | 1 |

TABLE 1-continued

| SECTOR | P | A | B | C | D | E |
|---|---|---|---|---|---|---|
| 24 | 1 | 1 | 0 | 1 | 0 | 1 |
| 25 | 0 | 1 | 1 | 1 | 0 | 1 |
| 26 | 1 | 0 | 1 | 1 | 0 | 1 |
| 27 | 0 | 0 | 1 | 0 | 0 | 1 |
| 28 | 1 | 1 | 1 | 0 | 0 | 1 |
| 29 | 0 | 1 | 0 | 0 | 0 | 1 |

It can be seen that codes A, B, C, D and E in combination constitute a Gray code. In other words, between any two adjacent sectors of first code disk 62, a transition between a 1 logic level and the 0 logic level occurs for only one of the codes A, B, C, D and E, although each of the sectors, which are numbered from sector 0 to sector 29, is uniquely identified by the combination of codes A, B, C, D and E for that sector. The angular position of first code disk 62 is therefore indicated by the Gray code output signals produced by the contact springs which are in sliding contact with the five tracks 92, 94, 96, 98 and 100. Since first code disk 62 rotates at a speed of one revolution in 30 minutes, a transition between one Gray code state and the next will occur once per minute.

Code P, produced by track 102, is used to generate a timing signal, as will be explained hereinafter.

Figure 3:
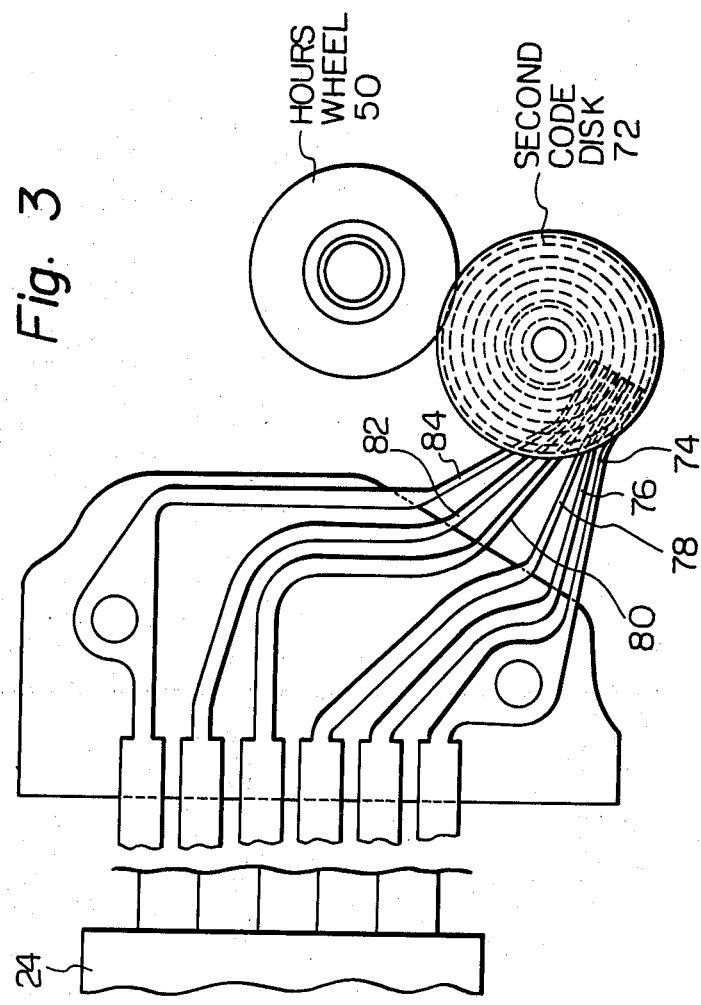
FIG. 3 is a view in plan of part of the electronic timepiece of FIG. 1 including a code disk.
Figure 5:
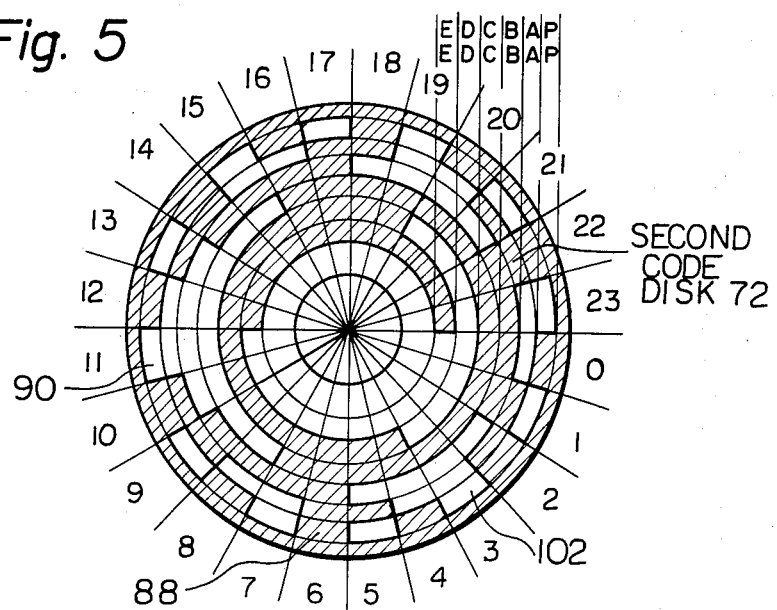
FIG. 5 is a plan view of a second code disk of the timepiece of FIG. 1, for providing hours information.

Referring now to FIG. 5, the surface of second code disk 72, which is in sliding contact with the contact springs 74, 76, 78, 80, 82 and 84 shown in FIG. 3, is illustrated. As in the case of first code disk 62, second code disk 72 is made of a non-conducting substrate upon a surface of which a pattern of conducting areas is formed in a fixed manner. Again, numeral 90 denotes a non-conducting area and numeral 88 a conducting area of the disk surface. The surface area of second code disk 72 is divided into a set of concentric circular tracks, as in the case of first code disk 62. The codes generated by these tracks, from the innermost to the outermost track, are designated as EE, DD, CC, BB, AA and PP respectively. The conductive and non-conductive areas are arranged into 24 sectors, which are numbered from sector 0 to sector 23 respectively. As the second code disk 72 rotates, digital code signals corresponding to the codes EE, DD, CC, BB, AA and PP are produced by the contact springs 84, 82, 80, 78, 76 and 74 respectively. A total of 24 code combinations can be identified by these signals produced from contact springs 74 to 84.

The codes PP, AA, BB, CC, DD and EE which result from rotation of second code disk 72 are shown in Table 2.

TABLE 2

| SECTOR | PP | AA | BB | CC | DD | EE |
|---|---|---|---|---|---|---|
| 0 | 1 | 0 | 1 | 1 | 0 | 0 |
| 1 | 0 | 1 | 1 | 1 | 0 | 0 |
| 2 | 1 | 1 | 0 | 1 | 0 | 0 |
| 3 | 0 | 0 | 0 | 1 | 0 | 0 |
| 4 | 1 | 0 | 0 | 1 | 1 | 0 |
| 5 | 0 | 1 | 0 | 1 | 1 | 0 |
| 6 | 1 | 1 | 1 | 1 | 1 | 0 |
| 7 | 0 | 0 | 1 | 1 | 1 | 0 |
| 8 | 1 | 0 | 1 | 0 | 1 | 0 |
| 9 | 0 | 1 | 1 | 0 | 1 | 0 |
| 10 | 1 | 1 | 0 | 0 | 1 | 0 |
| 11 | 0 | 0 | 0 | 0 | 1 | 0 |
| 12 | 1 | 0 | 0 | 0 | 1 | 1 |
| 13 | 0 | 1 | 0 | 0 | 1 | 1 |
| 14 | 1 | 1 | 1 | 0 | 1 | 1 |
| 15 | 0 | 0 | 1 | 0 | 1 | 1 |
| 16 | 1 | 0 | 1 | 1 | 1 | 1 |
| 17 | 0 | 1 | 1 | 1 | 1 | 1 |

TABLE 2-continued

| SECTOR | PP | AA | BB | CC | DD | EE |
|---|---|---|---|---|---|---|
| 18 | 1 | 1 | 0 | 1 | 1 | 1 |
| 19 | 0 | 0 | 0 | 1 | 1 | 1 |
| 20 | 1 | 0 | 0 | 1 | 0 | 1 |
| 21 | 0 | 1 | 0 | 1 | 0 | 1 |
| 22 | 1 | 1 | 1 | 1 | 0 | 1 |
| 23 | 0 | 0 | 1 | 1 | 0 | 1 |

It can be seen that codes AA, BB, CC, DD and EE, in combination, represent a Gray code. Thus, as in the case of first code disk 62, a transition between the 1 logic level and the 0 logic level occurs for only one of the codes AA, BB, CC, DD and EE, between any two adjacent sectors of second code disk 72. The angular position of second code disk 72 is therefore indicated by the Gray code output signals produced by contact springs 74, 76, 78, 80 and 84. Since second code disk 72 rotates at a speed of one revolution in 12 hours, a transition between one Gray code state and the next will occur twice per hour.

Code PP, generated by contact spring 74, is used to generate a timing signal, as will be explained hereinafter.

In the present embodiment, the positional relationships between the first and second code disks 62 and 72, and the seconds hand, minutes hand and hours hand of the analog display 20 are such that, when the seconds hand, minutes hand and hours hand of analog display 20 are indicating the time 12:00:00 (i.e. precisely 12 o-clock), then the contact springs of first code disk 62 are positioned on the boundary between sector 29 and sector 0, while the contact springs 74 to 84 of second code disk 72 are positioned on the boundary between sector 23 and sector 0. Thus, at any point in time, the hour and minute which are indicated by the hours hand and minutes hand of analog display 20 can be determined by investigating the Gray code combinations produced by the contact springs of first code disk 62 and second code disk 72. This is true irrespective of whether the timepiece is being advanced normally or the time indicated by the hours and minutes hands is being corrected by the user rotating the winding stem to actuate wheel train 18.

Figure 7B:
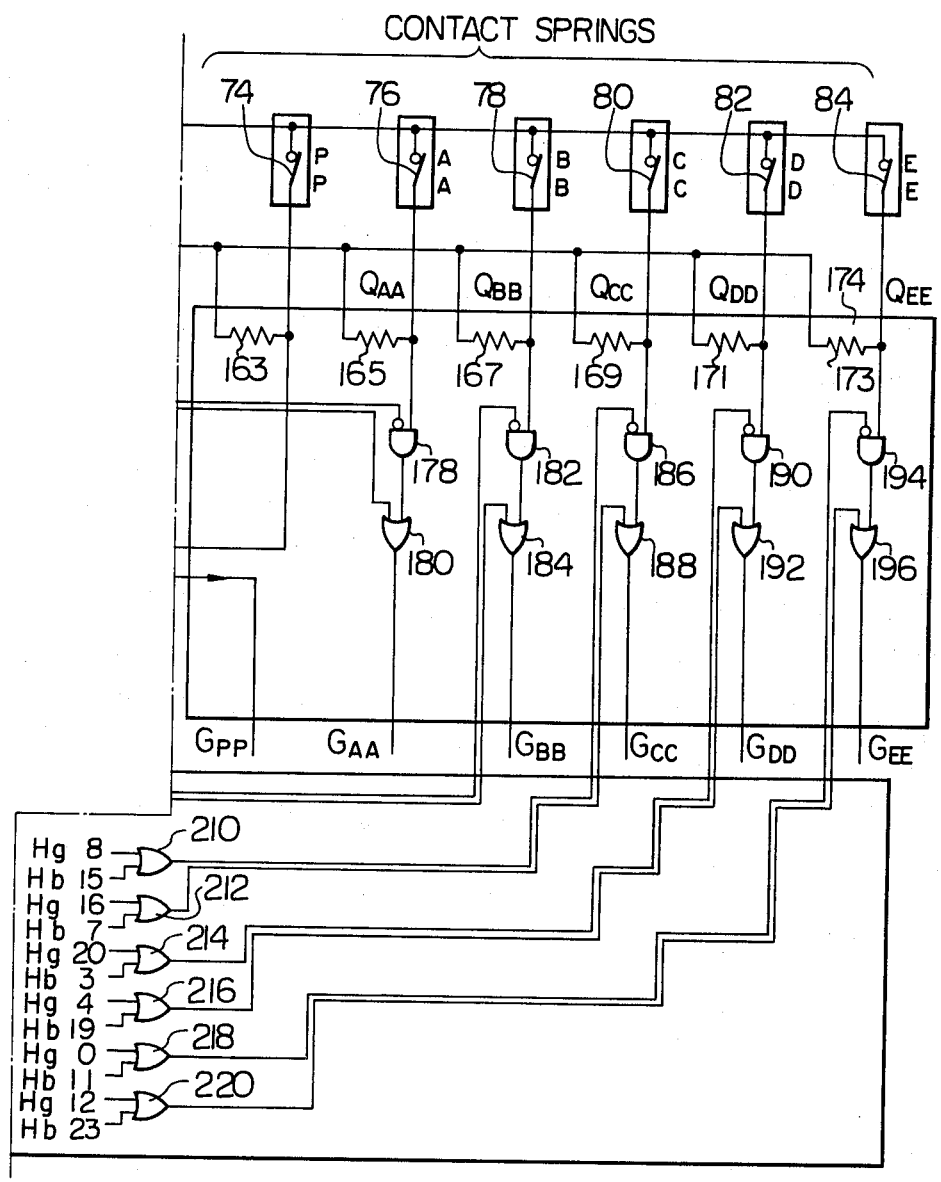
FIG. 7 is a circuit diagram of a second code processing circuit of the timepiece of FIG. 1, for providing hours information in encoded form.

FIGS. 6 and 7 are general circuit diagrams of the code processing circuit 24 indicated in FIG. 1. The circuit of FIG. 6 processes the digital code signals produced by the contact springs of the first code disk 62, while the circuit of FIG. 7 processes the digital code signals produced by the contact springs of the second code disk 72. The circuit of FIG. 6 comprises a first code correction circuit 118, a first timing signal generating circuit 116, and a first correction signal generating circuit 140. Numerals 104, 106, 108, 110, 112 and 114 denote contact springs which are in sliding contact at one end with the surface of first code disk 62, to thereby produce code signals P, A, B, C, D and E respectively. The other end of each of contact springs 104 to 114 is connected to the negative potential of the timepiece battery, i.e. to the 0 logic level, through resistors 105, 107, 109, 111, 113, and 115 respectively. Code signal $Q_P$, produced by contact spring 104, is applied through first code correction circuit 118 to an input of first timing signal generator circuit 116. Numeral 117 denotes a switch which is actuated by shaft 36 carrying the seconds hand of the timepiece, to generate a short duration pulse, denoted by the letter S, each time the seconds hand of the timepiece attains the 00 second position. A timing signal CCMP is produced by timing signal generator circuit 116, which is passed through first code correction circuit 118 without being changed, to be output as signal $G_P$. Code signal $Q_A$ from switch 106 is applied to an input of AND gate 120, the output of which is applied to one input of an OR gate 122. The output signal from OR gate 122 is designated as $G_A$. Similarly, code signal $Q_B$ from contact spring 108 is applied to an input of an AND gate 124, the output of which is applied to an input of an OR gate 126. The output signal from OR gate 126 is designated as $G_B$. The code signal $Q_C$ from contact spring 110 is applied to an input of an AND gate 128, the output of which is applied to an input of an OR gate 130. The output from OR gate 130 is designated as $G_C$. The code signal $Q_D$ from contact spring 112 is applied to an input of an AND gate 132, the output of which is applied to an input of an OR gate 134. The output signal from OR gate 134 is designated as $G_D$. Code signal $Q_E$ from contact spring 114 is applied to an input of an AND gate 136, the output of which is applied to an input of an OR gate 138. The output signal from OR gate 138 is designated as $G_E$.

The output signals $G_P$, $G_A$, $G_B$, $G_C$, $G_D$ and $G_E$ from first code correction circuit are applied to a set of first gate circuits in first correction signal generator circuit 140. These first gate circuits are not shown in FIG. 6. Thirty output signals, numbered successively from Mg 0 to Mg 29 are output from these first gate circuits in response to each of the combinations of signals $G_P$, $G_A$, $G_B$, $G_C$, $G_D$ and $G_E$ applied to them. The relationships between these signals Mg 0 to Mg 29 and the combinations of signals $G_P$ to $G_E$ which produce them are shown in Table 3.

TABLE 3

| SYMBOL | OUTPUT SIGNAL |
|---|---|
| Mg 0 | $G_P \times G_A \times \overline{G_B} \times \overline{G_C} \times \overline{G_D}$ |
| Mg 1 | $\overline{G_P} \times G_A \times \overline{G_C} \times \overline{G_D} \times \overline{G_E}$ |
| Mg 2 | $G_P \times G_B \times \overline{G_C} \times \overline{G_D} \times \overline{G_E}$ |
| Mg 3 | $\overline{G_P} \times \overline{G_A} \times G_B \times \overline{G_D} \times \overline{G_E}$ |
| Mg 4 | $G_P \times G_B \times G_C \times \overline{G_D} \times \overline{G_E}$ |
| Mg 5 | $\overline{G_P} \times G_A \times G_C \times \overline{G_D} \times \overline{G_E}$ |
| Mg 6 | $G_P \times \overline{G_B} \times G_C \times \overline{G_D} \times \overline{G_E}$ |
| Mg 7 | $\overline{G_P} \times \overline{G_A} \times \overline{G_B} \times G_C \times \overline{G_E}$ |
| Mg 8 | $G_P \times \overline{G_B} \times G_C \times G_D \times \overline{G_E}$ |
| Mg 9 | $\overline{G_P} \times G_A \times G_C \times G_D \times \overline{G_E}$ |
| Mg 10 | $G_P \times G_B \times G_C \times G_D \times \overline{G_E}$ |
| Mg 11 | $\overline{G_P} \times \overline{G_A} \times G_B \times G_D \times \overline{G_E}$ |
| Mg 12 | $G_P \times G_B \times \overline{G_C} \times G_D \times \overline{G_E}$ |
| Mg 13 | $\overline{G_P} \times G_A \times \overline{G_C} \times G_D \times \overline{G_E}$ |
| Mg 14 | $G_P \times \overline{G_B} \times \overline{G_C} \times G_D \times \overline{G_E}$ |
| Mg 15 | $\overline{G_P} \times \overline{G_A} \times \overline{G_B} \times \overline{G_C} \times G_D$ |
| Mg 16 | $G_P \times \overline{G_B} \times \overline{G_C} \times G_D \times G_E$ |
| Mg 17 | $\overline{G_P} \times G_A \times \overline{G_C} \times G_D \times G_E$ |
| Mg 18 | $G_P \times G_B \times \overline{G_C} \times G_D \times G_E$ |
| Mg 19 | $\overline{G_P} \times \overline{G_A} \times G_B \times G_D \times G_E$ |
| Mg 20 | $G_P \times G_B \times G_C \times G_D \times G_E$ |
| Mg 21 | $\overline{G_P} \times G_A \times G_C \times G_D \times G_E$ |

TABLE 3-continued

| SYMBOL | OUTPUT SIGNAL |
| --- | --- |
| Mg 22 | GP × $\overline{GB}$ × GC × GD × GE |
| Mg 23 | $\overline{GP}$ × $\overline{GA}$ × $\overline{GB}$ × GC × GE |
| Mg 24 | GP × $\overline{GB}$ × GC × $\overline{GD}$ × GE |
| Mg 25 | $\overline{GP}$ × GA × GC × $\overline{GD}$ × GE |
| Mg 26 | GP × GB × GC × $\overline{GD}$ × GE |
| Mg 27 | $\overline{GP}$ × $\overline{GA}$ × GB × $\overline{GD}$ × GE |
| Mg 28 | GP × GB × $\overline{GC}$ × $\overline{GD}$ × GE |
| Mg 29 | $\overline{GP}$ × GA × $\overline{GC}$ × $\overline{GD}$ × GE |

Signals $G_P$, $G_A$, $G_B$, $G_C$, $G_D$ and $G_E$ are also applied in various combinations to a second set of gate circuits in first correction signal generator circuit 140 (also not shown in FIG. 6), which produce a set of 30 signals designated as Mb 0 to Mb29. The relationships between signals $G_A$ to $G_E$ and signals Mb 0 to Mb29 are shown in Table 4.

TABLE 4

| SYMBOL | OUTPUT SIGNAL |
| --- | --- |
| Mb 0 | GP × GA × $\overline{GC}$ × $\overline{GD}$ × $\overline{GE}$ |
| Mb 1 | $\overline{GP}$ × GB × $\overline{GC}$ × $\overline{GD}$ × $\overline{GE}$ |
| Mb 2 | GP × $\overline{GA}$ × GB × $\overline{GD}$ × $\overline{GE}$ |
| Mb 3 | $\overline{GP}$ × GB × GC × $\overline{GD}$ × $\overline{GE}$ |
| Mb 4 | GP × GA × GC × $\overline{GD}$ × $\overline{GE}$ |
| Mb 5 | $\overline{GP}$ × $\overline{GB}$ × GC × $\overline{GD}$ × $\overline{GE}$ |
| Mb 6 | GP × $\overline{GA}$ × $\overline{GB}$ × GC × $\overline{GE}$ |
| Mb 7 | $\overline{GP}$ × $\overline{GB}$ × GC × GD × $\overline{GE}$ |
| Mb 8 | GP × GA × GC × GD × $\overline{GE}$ |
| Mb 9 | $\overline{GP}$ × GB × GC × GD × $\overline{GE}$ |
| Mb 10 | GP × $\overline{GA}$ × GB × GD × $\overline{GE}$ |
| Mb 11 | $\overline{GP}$ × GB × $\overline{GC}$ × GD × $\overline{GE}$ |
| Mb 12 | GP × GA × $\overline{GC}$ × GD × $\overline{GE}$ |
| Mb 13 | $\overline{GP}$ × $\overline{GB}$ × $\overline{GC}$ × GD × $\overline{GE}$ |
| Mb 14 | GP × $\overline{GA}$ × $\overline{GB}$ × $\overline{GC}$ × GD |
| Mb 15 | $\overline{GP}$ × $\overline{GB}$ × $\overline{GC}$ × GD × GE |
| Mb 16 | GP × GA × $\overline{GC}$ × GD × GE |
| Mb 17 | $\overline{GP}$ × GB × $\overline{GC}$ × GD × GE |
| Mb 18 | GP × $\overline{GA}$ × GB × GD × GE |
| Mb 19 | $\overline{GP}$ × GB × GC × GD × GE |
| Mb 20 | GP × GA × GC × GD × GE |
| Mb 21 | $\overline{GP}$ × $\overline{GB}$ × GC × GD × GE |
| Mb 22 | GP × $\overline{GA}$ × $\overline{GB}$ × GC × GE |
| Mb 23 | $\overline{GP}$ × $\overline{GB}$ × GC × $\overline{GD}$ × GE |
| Mb 24 | GP × GA × GC × $\overline{GD}$ × GE |
| Mb 25 | $\overline{GP}$ × GB × GC × $\overline{GD}$ × GE |
| Mb 26 | GP × $\overline{GA}$ × GB × $\overline{GD}$ × GE |
| Mb 27 | $\overline{GP}$ × GB × $\overline{GC}$ × $\overline{GD}$ × GE |
| Mb 28 | GP × GA × $\overline{GC}$ × $\overline{GD}$ × GE |
| Mb 29 | $\overline{GP}$ × GA × $\overline{GB}$ × $\overline{GC}$ × $\overline{GD}$ |

Combinations of signals Mg 0 to Mg 29 and Mb 0 to Mb29 are applied to inputs of OR gates 142, 144, 146, 148 150, 152, 154, 156, 158 and 160 shown in FIG. 6, in correction signal generating circuit 140. The output of OR gate 142 is applied to an inverting input terminal of AND gate 120, so that when this output signal is at the 1 logic level, AND gate 120 is inhibited. The output of OR gate 144 is applied to a second input of OR gate 122. The output of OR gate 146 is applied to an inverting input of AND gate 124. The output of OR gate 148 is applied to a second input of OR gate 126. The outputs of OR gates 150, 154 and 158 are applied to inverting inputs of AND gates 128, 132 and 136, repsectively. The outputs of OR gates 152, 156 and 160 are applied to inputs of OR gates 130, 134 and 138 respectively.

The circuit of FIG. 7 comprises a second code correction circuit 174, a second timing signal generating circuit 176, and second correction signal generating circuit 200. Contact springs 74, 76, 78, 80, 82 and 84 which are in sliding contact with the surface of second code disk 72 at one end, produce code signals $Q_{PP}$, $Q_{AA}$, $Q_{BB}$, $Q_{CC}$, $Q_{DD}$ and $Q_{EE}$, respectively. The other end of each of contact springs 74 to 84 is connected to the 0 logic level potential though resistors 163, 165, 167, 169, 171 and 173, respectively. Code signal PP produced by contact spring 74, is applied through second code correction circuit 174 without change to an input of second timing signal generator circuit 176. Second timing signal generator circuit 176 produces a timing signal CCHPP, which is passed through second code correction circuit 174 without change, and is output as a synchronized digital code signal, designated as signal Gpp.

Codd signal $Q_{AA}$ from contact spring 76 is applied to one input of an AND gate 178, the output of which is applied to an input of an OR gate 180. The output signal from Or gate 180 is a synchronized digital code signal, designated as $G_{AA}$. Code signal $Q_{BB}$ from contact spring 78 is applied to one input of an AND gate 182, the output of which is applied to one input of an OR gate 184. The output signal from OR gate 184 is designated as $G_{BB}$. The code signal $Q_{CC}$ from contact spring 80 is applied to one input of an AND gate 186, the output of which is applied to one input of an OR gate 188. The output signal from OR gate 188 is designated as $G_{CC}$. Code signal $Q_{DD}$ from contact spring 82 is applied to an input of an AND gate 190, the output of which is applied to one input of an OR gate 192. The output signal from OR gate 192 is designated as $G_{DD}$. Code signal $Q_{EE}$ from contact spring 84 is applied to one input of an AND gate 194, the output of which is applied to one input of an OR gate 196. The output signal from OR gate 196 is designated as $G_{EE}$.

The synchronized digital code signals $G_{PP}$, $G_{AA}$, $G_{BB}$, $G_{CC}$, $G_{DD}$ and $G_{EE}$ from second code correction circuit 174 are applied in various combinations to a set of first gate circuits in second correction signal ganerator circuit 200. These first gate circuits are not shown in FIG. 7. 24 output signals, numbered from Hg 0 to Hg23 are produced from these first gate circuits. The relationships between these signals Hg 0 to Hg23 and the combinations of signal $G_{PP}$, $G_{AA}$, $G_{BB}$, $G_{CC}$, $G_{DD}$ and $G_{EE}$ which produce them are shown in Table 5.

TABLE 5

| SYMBOL | OUTPUT SIGNAL |
| --- | --- |
| Hg 0 | GPP × $\overline{GAA}$ × GBB × GCC × $\overline{GDD}$ |
| Hg 1 | $\overline{GPP}$ × GBB × GCC × $\overline{GDD}$ × $\overline{GEE}$ |

TABLE 5-continued

| SYMBOL | OUTPUT SIGNAL |
| --- | --- |
| Hg 2 | GPP × GAA × GCC × $\overline{GDD}$ × $\overline{GEE}$ |
| Hg 3 | $\overline{GPP}$ × $\overline{GBB}$ × GCC × $\overline{GDD}$ × GEE |
| Hg 4 | GPP × $\overline{GAA}$ × $\overline{GBB}$ × GCC × $\overline{GEE}$ |
| Hg 5 | $\overline{GPP}$ × $\overline{GBB}$ × GCC × GDD × GEE |
| Hg 6 | GPP × GAA × GCC × GDD × $\overline{GEE}$ |
| Hg 7 | $\overline{GPP}$ × GBB × GCC × GDD × $\overline{GEE}$ |
| Hg 8 | GPP × $\overline{GAA}$ × GBB × GDD × $\overline{GEE}$ |
| Hg 9 | $\overline{GPP}$ × GBB × $\overline{GCC}$ × GDD × $\overline{GEE}$ |
| Hg 10 | GPP × GAA × $\overline{GCC}$ × GDD × $\overline{GEE}$ |
| Hg 11 | $\overline{GPP}$ × $\overline{GBB}$ × $\overline{GCC}$ × GDD × $\overline{GEE}$ |
| Hg 12 | GPP × $\overline{GAA}$ × $\overline{GBB}$ × $\overline{GCC}$ × GDD |
| Hg 13 | $\overline{GPP}$ × $\overline{GBB}$ × $\overline{GCC}$ × GDD × GEE |
| Hg 14 | GPP × GAA × $\overline{GCC}$ × GDD × GEE |
| Hg 15 | $\overline{GPP}$ × GBB × $\overline{GCC}$ × GDD × GEE |
| Hg 16 | GPP × $\overline{GAA}$ × GBB × GDD × GEE |
| Hg 17 | $\overline{GPP}$ × GBB × GCC × GDD × GEE |
| Hg 18 | GPP × GAA × GCC × GDD × GEE |
| Hg 19 | $\overline{GPP}$ × $\overline{GBB}$ × GCC × GDD × GEE |
| Hg 20 | GPP × $\overline{GAA}$ × $\overline{GBB}$ × GCC × GEE |
| Hg 21 | $\overline{GPP}$ × $\overline{GBB}$ × GCC × $\overline{GDD}$ × GEE |
| Hg 22 | GPP × GAA × GCC × $\overline{GDD}$ × GEE |
| Hg 23 | $\overline{GPP}$ × GBB × GCC × $\overline{GDD}$ × GEE |

Signals $G_{PP}$, $G_{AA}$, $G_{BB}$, $G_{CC}$, $G_{DD}$ and $G_{EE}$ are also applied to a second set of gate circuits in second correction signal generator circuit 200, (also not shown in FIG. 7), to produce a set of 24 signals designated as Hb 0 to Hb23. The relationships between the combinations of signals $G_{PP}$ to $G_{EE}$ which are applied to these second gate circuits and the resulting signals Hb 0 to Hb 23 are shown in Table 6.

TABLE 6

| SYMBOL | OUTPUT SIGNAL |
| --- | --- |
| Hb 0 | GPP × GBB × GCC × $\overline{GDD}$ × $\overline{GEE}$ |
| Hb 1 | $\overline{GPP}$ × GAA × GCC × $\overline{GDD}$ × $\overline{GEE}$ |
| Hb 2 | GPP × $\overline{GBB}$ × GCC × $\overline{GDD}$ × $\overline{GEE}$ |
| Hb 3 | $\overline{GPP}$ × $\overline{GAA}$ × $\overline{GBB}$ × GCC × $\overline{GEE}$ |
| Hb 4 | GPP × $\overline{GBB}$ × GCC × GDD × $\overline{GEE}$ |
| Hb 5 | $\overline{GPP}$ × GAA × GCC × GDD × $\overline{GEE}$ |
| Hb 6 | GPP × GBB × GCC × GDD × $\overline{GEE}$ |
| Hb 7 | $\overline{GPP}$ × $\overline{GAA}$ × GBB × GDD × $\overline{GEE}$ |
| Hb 8 | GPP × GBB × $\overline{GCC}$ × GDD × $\overline{GEE}$ |
| Hb 9 | $\overline{GPP}$ × GAA × $\overline{GCC}$ × GDD × $\overline{GEE}$ |
| Hb 10 | GPP × $\overline{GBB}$ × $\overline{GCC}$ × GDD × $\overline{GEE}$ |
| Hb 11 | $\overline{GPP}$ × $\overline{GAA}$ × $\overline{GBB}$ × $\overline{GCC}$ × GDD |
| Hb 12 | GPP × $\overline{GBB}$ × $\overline{GCC}$ × GDD × GEE |
| Hb 13 | $\overline{GPP}$ × GAA × $\overline{GCC}$ × GDD × GEE |
| Hb 14 | GPP × GBB × $\overline{GCC}$ × GDD × GEE |
| Hb 15 | $\overline{GPP}$ × $\overline{GAA}$ × GBB × GDD × GEE |

TABLE 6-continued

| SYMBOL | OUTPUT SIGNAL |
| --- | --- |
| Hb 16 | GPP × GBB × GCC × GDD × GEE |
| Hb 17 | $\overline{GPP}$ × GAA × GCC × GDD × GEE |
| Hb 18 | GPP × $\overline{GBB}$ × GCC × GDD × GEE |
| Hb 19 | $\overline{GPP}$ × $\overline{GAA}$ × $\overline{GBB}$ × GCC × GEE |
| Hb 20 | GPP × $\overline{GBB}$ × GCC × $\overline{GDD}$ × GEE |
| Hb 21 | $\overline{GPP}$ × GAA × GCC × $\overline{GDD}$ × GEE |
| Hb 22 | GPP × GBB × GCC × $\overline{GDD}$ × GEE |
| Hb 23 | $\overline{GPP}$ × $\overline{GAA}$ × GBB × GCC × $\overline{GDD}$ |

Combinations of signals Hg 0 to Hg23 and Hb 0 to Hb 23 are applied to OR gates 202, 204, 206, 208, 210, 212, 214, 216, 218 and 220 in second correction signal generator circuit 200. The output of OR gate 202 is applied to an inverting input of AND gate 178. The output of OR gate 204 is applied to an input of OR gate 180. The output of OR gate 206 is applied to an inverting input of AND gate 182. The output of OR gate 208 is applied to an input of OR gate 184. The outputs of OR gates 210, 214 and 218 are applied to inverting inputs of AND gates 186, 190 and 194 respectively. The outputs of OR gates 212, 216 and 220 are applied to inputs of OR gates 188, 192 and 196, respectively.

The manner in which the code signals produced by the contact springs and code disk 62 are processed will now be described, with reference to FIGS. 4 and 6, and Tables 1, 3 and 4. As stated previously, each of the 30 sectors of first code disk 62 is identified by a corresponding combination of codes A, B, C, D and E. These constitute a Gray code, for which only one of the codes A to E changes in logic level between one sector and the succeeding sector, as first code disk rotates. For example, between sector 0 and sector 1, the only code for which a charge occurs is code B, which changes from the 0 to the 1 logic level. Between sector 1 and sector 2, the only code for which a change occurs is code A, which changes from the 1 to the 0 logic level. This characteristic of the Gray code is illustrated by Table 1. The concentric tracks corresponding to the five code A, B, C, D and E are arranged in order from the outer part to the center of first code disk 62. For the present embodiment, if there is a manufacturing error which causes the position of the boundary between a conducting and a non-conducting segment of the outer code track 100 and if this error amounts to 20 μm, then an error of 3.5 seconds will occur in the timing of a transition in logic levels of code A. This timing error will occur if we assume that the code track 100 is located at a distance of 1.6 mm from the center of code disk 62. If the same magnitude of manufacturing error occurs on the innermost code track 92, and if code track 92 is located at a distance of 0.8 mm from the center of code disk 62, which is the case for the present embodiment, then a error of 7 seconds will occur in the timing of a transition between logic levels of code E. The timing error referred to above will result in the time information represented by codes A to E generated by contact springs 106 to 114 being different from the time indicated by the hands of the timepiece. It can be seen that the sensitivity of such timing errors to errors in manufacturing the code tracks is a maximum for the innermost code track and is a minimum for the outermost code track. Code track 102 in FIG. 4 is provided to generate an auxiliary code P which is utilized to reduce the effects of timing errors caused by manufacturing tolerances, as will be described in the following.

Consider for example the transition from sector 1 to sector 2. There is no change in code B, which remains at the 1 level, no change in code C which remains at the 0 level, as does codes D and E. Only code A changes, from the 1 to the 0 level. Since code track 102, from which code P is generated is located farther from the center of code disk 62 than is code track 100 from which code A is generated, a higher degree of timing accuracy can be obtained by utilizing the transition from the 0 level to the 1 level which occurs for code P, from sector 1 to sector 2, to detect the transition of code A. This is done by producing a signal which is the logical product $(P \times B \times \overline{C} \times \overline{D} \times \overline{E})$. The transition from the 0 level to the 1 level of this signal provides the accurate timing at which the transition from the 1 level to the 0 level of code P should occur, between sector 1 and sector 2. When contact springs 104, 106, 108, 110, 112 and 114 are positioned at sector 1, then the signals produced by these contact springs are at the 0, 1, 1, 0, 0 and 0 levels respectively. Thus, the outputs of OR gates 142 and OR gates 146 to 160 are at the 0 logic level, while the output of OR gate 144 is at the 1 logic level. As a result, the synchronized digital code signals $G_P$, $G_A$, $G_B$, $G_C$, $G_C$, $G_E$ are at the 0, 1, 1, 0, 0 and 0 logic levels respectively. As code disk 62 rotates, the contact springs 104 to 114 begin to approach the boundary between sectors 1 and 2. We shall first assume that the change in logic level (from 0 to 1) of the signal from contact spring 104, which we shall designate as auxiliary code signal $Q_P$, precedes the change in logic level (from 1 to 0) of the signal $Q_A$ from contact spring 106. Such a difference in logic level transitions could result from manufacturing error, as described above. When this transition of signal $Q_P$ occurs, then signal $(G_P \times G_B \times \overline{G_C} \times \overline{G_D} \times \overline{G_E})$, which is designated as signal Mg 2 (in Table 3) will go from the 0 level to the 1 level. The output of OR gate 142 will therefore go to the 1 level. Signal Mb 1, shown in Table 3 and FIG. 6, will go to the 0 level simultaneously, causing the output of OR gate 144 to go to the 0 level. The outputs of AND gate 120 and of OR gate 122 will therefore go to the 0 level, i.e. signal $G_A$ will go to the 0 level, in spite of the fact that signal $Q_A$ is still at the 1 level.

If, on the other hand, we assume that the change in logic level (from 1 to 0) of signal $Q_A$ precedes that of signal $Q_P$ (from 0 to 1), then when signal $Q_A$ goes to the 0 level, signal Mb 1, which is $(\overline{G_P} \times G_B \times \overline{G_C} \times \overline{G_D} \times \overline{G_E})$, will still be at the 1 level, so that signal $G_A$ will remain at the 1 logic level, until the transition of signal $Q_P$ occurs. From the above, it will be apparent that the timing of a transition from one combination of signals $G_A$, $G_B$, $G_C$, $G_D$ and $G_E$, indicating a transition from one sector to the next, on first code disk 62, is determined by a synchronized timing signal $G_P$, which is very close in timing to signal $Q_P$, as will be explained hereinafter. This is true for all of the signals $G_A$, $G_B$, $G_C$, $G_D$ and $G_E$.

Such an arrangement has the advantage of providing highly accurate timing of the transitions of each of the signals $G_A$ to $G_E$ which designated the transitions between the various sectors of first code disk 62. Since the timing accuracy is determined by a single code track on first code disk 62, it is only necessary to manufacture this track of the disk to a very high degree of accuracy, rather than all of the tracks 92, 94, 96, 98 and 100. In addition, since code track 102 of first code disk 62 is the outermost code track, it provides the highest revolution for detecting the transitions between successive sectors, and the accuracy of this detection is less affected by manufacturing errors than is the case for the other code tracks.

The above remarks are also true for second code disk 72. In this case, signal $Q_{PP}$ which is produced from contact spring 74 is used to generate a highly precise timing signal $G_{PP}$, which controls the timing of logic level transitions of signals produced by OR gates 202, 204, 206, 208 and 210 to 220. The signals produced from these OR gates are applied to AND gates 178, 182, 186, 190 and 194, and to OR gates 180, 184, 188, 192 and 196, to control the timing of logic level transitions of signals $G_{AA}$, $G_{BB}$, $G_{CC}$, $G_{DD}$ and $G_{EE}$ respectively. Combinations of signals $G_{AA}$ to $G_{EE}$ therefore accurately represent the positions of the 24 sectors of second code disk 72. The combinations of signals $G_P$, $G_A$, $G_B$, $G_C$, $G_D$ and $G_E$ which are used to form signals Hb 0 to Hb 23 and Hg 0 to Hg 23 are shown in Tables 5 and 6.

In an electronic timepiece having time indicating hands, the exact timing of each transition from one minute to the next is, in general, indicated to a high degree of accuracy by the seconds hands of the timepiece reaching the 00 second position on the dial. When time setting with reference to a standard broadcast time signal is performed, for example, the seconds hand is immediately reset to the 00 second position by the user actuating an external operating member at the appropriate instant. Setting of the minutes hand, however, is performed to a lower degree of precision, for example by rotating the timepiece crown and winding stem. Thus, although the successive transitions between logic levels of signal $Q_P$ generated from first code disk 62 accurately indicate the transitions from one minute to the next, as indicated by the minutes hand of the timepiece, there will almost certainly be some degree of discrepancy between the timing of these transitions and the timing at which the seconds hand of the timepiece reaches the 00 second position on the dial. The amount of this discrepancy will depend upon how carefully the user adjusts the position of the minutes hand when time setting is performed. If signal $Q_P$ were used directly to control the timing of signals $G_A$, $G_B$, $G_C$, $G_D$ and $G_E$, then this discrepancy between the time indications of the minutes and seconds hands could be source of error in, for example, a digital display of time information based upon signals $G_A$ to $G_E$. For this reason, the timing signal generator circuit 116 utilizes a synchronizing signal S, which consists of a short pulse that is produced each time the seconds hand reaches the 00 second position, in conjunction with auxiliary code signal $Q_P$, to produce a synchronized timing signal $G_P$. $G_P$ is a timing signal which is almost identical to signal $Q_P$, but whose logic level transition timings are determined by signal S, to a high degree of precision. Signal S is generated by a switch 117, which is actuated by a cam mounted on the shaft which carries the seconds hand of the timepiece. If the difference between the time indicated by the minutes hand and that indicated by the seconds hand exceeds a predetermined amount, then this fact is detected by first timing signal generating circuit 116, which then causes auxiliary code signal $Q_P$ to be output directly as signal CCMP, and thus as signal $G_P$. In this case, a warning indication can be given to the timepiece user to notify that the minutes hand and seconds hand are excessively misaligned. It should also be noted that, since signal S is used to determine the precise timing of each logic level transition of signal $G_P$ (and hence of each of the signals $G_A$ to $G_E$), slight errors in the angular position of first code disk 62 relative to, the position the minutes hand (caused by such factors as backlash in the gears, manufacturing errors, etc.), as well as any slight errors in the positioning of the conducting and nonconducting areas of code track 103 of first code disk 62, will not result in error in the digital time information represented by signals $G_A$ to $G_E$. This means that the various mechanical components of the analog-to-digital conversion system of this embodiment of the present invention need not be manufactured to extremely high degrees of tolerance. Manufacturing costs can thus be held to a reasonable level, without loss in accuracy of the digital time information which is provided.

Referring now to FIG. 8, the operation of timing signal generating circuit 116 will be described. This circuit is composed of a synchronizing circuit 164 and a judgement circuit 162. As stated previously, output signal CCMP of timing signal generation circuit 116 is synchronized by means of signal S, so long as the timings of signals S and $Q_P$ are within a predetermined range, i.e. so long as the minutes hand and seconds hand of the timepiece are synchronized to within a predetermined range. The decision as to whether the timings of signals S and $Q_P$ are within this range is made by judgement circuit 162, as described hereinafter.

The waveforms of various signals concerned with timing signal generation circuit 116 are shown in FIGS. 10A, 10B and 10C. As stated previously, synchronizing signal S is a short pulse which is produced once per minute to indicate that the seconds hand of the timepiece is at the 00 second position. A 1-minute signal (not shown in FIGS. 10A to 10C) is produced by seconds counter 30, and comprises a short duration pulse produced once per minute. Signal M, shown in FIG. 8 and in FIGS. 10A to 10D, goes to the 1 logic level 20 seconds prior to the mid-point of each of the 1-minute pulses, and returns to the 0 logic level 20 seconds after the mid-point of each 1-minute pulse, i.e. signal M comprises a train of 40 second pulse-width pulses, as indicated in FIG. 10B. These will be designated as masking pulses.

Signal T0, which comprises a single positive-going pulse of narrow width, is produced at the instant when power is applied to the timepiece, i.e. when the timepiece battery is first inserted or is replaced. Signal T1 comprises a positive-going pulse which is generated when the timepiece is changed over from the hand-setting operating state to the normal operating state. Signal U is at the 1 logic level when the timepiece is in the hand-setting state, and is at the 0 logic level when the timepiece is in the normal operating condition. The above signals are applied to timing signal generating circuit 116, as shown in FIG. 8.

The timing of each 0 logic level to 1 logic level transition of signal $Q_P$ can be either leading or lagging with respect to signal S. FIG. 10A shows the condition in which signal $Q_P$ is leading signal S. As explained previously, signals $Q_P$ and S are unlikely to be precisely synchronized.

The operation of synchronizing circuit 164 will first be described assuming that signal J which is a control signal applied from judgement circuit 162 is at the 0 level. This state of the J signal indicates that the timings of signals S and $Q_P$ are within the predetermined range, as described previously. Signal J is applied to an inverting input terminal of an AND gate 166, which receives masking signal M at another input. Masking signal M is therefore output from AND gate 166, and applied to an input of an AND gate 170 and to an inverting input of an AND gate 168. Signal $Q_P$ is applied to another input of AND gate 168, the output of which is designated as signal A. A signal K from the output of a NOR gate in a set/reset flip-flop 187 comprising NOR gates 186 and 188, is applied to a second input of AND gate 170. The output signal from AND gate 170 is designated as B. If it is assumed that signal K is at the 0 logic level, then it will be apparent that signals M and $Q_P$ are both at the 0 logic level, the signals A and B will also be at the 0 logic level. Output signal CCMP, which is output from OR gate 172 which receives signals A and B, will therefore be at the 0 logic level. Signal CCMP is applied to an inverter 190, the output of which is applied to a second inverter 192, so that if CCMP is at the 0 logic level, the output of inverter 192 will be at the 0 level. The output of inverter 192 is applied to inverting inputs of AND gates 174 and 180, and to inputs of AND gates 176 and 178. A signal (S+T1) is applied to an inverting input of AND gate 174 and AND gate 176, and is applied to inputs of AND gates 178 and 180. Thus, if signal CCMP is at the 0 logic level, then the output of AND gate 174 will be at the 1 logic level when both signal S and signal T1 are at the 0 logic level. The output signal from AND gate 174, designated as C, is applied through an OR gate 182, to an input of NOR gate 186 of the set/reset flip-flop. At this time, the outputs of AND gates 176, 178 and 180 are at the 0 logic level, so that the 1 level output of AND gate 174 causes output K of the set/reset flip-flop 187 to be set to the 0 logic level.

If now masking signal M goes to the 1 logic level, then the output of AND gate 166 goes to the 1 logic level. If signal $Q_P$ is still at the 0 logic level, then signal CCMP will remain at the 0 level, since signal K is at the 0 logic level, thereby inhibiting AND gate 170. Output signals C, D, E and F from AND gates 174, 176, 178 and 180 therefore remain at their previous logic levels.

In this condition, if a pulse S occurs, i.e. signal S momentarily goes to the 1 logic level, then signal C from AND gate 174 will go to the 0 level, while signal F from AND gate 180 will go to the 1 logic level. As a result, the output of OR gate 184 will go to the 1 level, causing output K of set/reset flip-flop 187 to go to the 1 logic level. At this time, the output of AND gate 166 is at the 1 logic level. Thus, the output of AND gate 170 goes to the 1 level, so that output signal CCMP goes to the 1 logic level. This process is illustrated in the first part of the waveform diagrams of FIG. 10A. As a result of signal CCMP going to the 1 level, the output of inverter 192 goes to the 1 level, so that the output of AND gate 176, signal E, goes to the 1 level when signal S returns to the 0 logic level. The output of OR gate 184 is therefore held at the 1 logic level, so that signal K from set/reset flip-flop 187 remains held at the 1 logic level.

When masking signal M now goes to the 0 level, then the output of AND gate 166 goes to the 0 level. This causes signal B from AND gate 170 to go to the 0 level. Output signal CCMP remains at the 1 level due to the 1 level output from AND gate 168. Signals C, D and F therefore remain at the 0 logic level, and signals E and K at the 1 level.

When signal M returns to the 1 level, then signal A from AND gate 168 goes to the 0 level, and signal B from AND gate 170 goes to the 1 level, so that signal CCMP remains at the 1 level. The signals C, D, E, F and K remain at their previous logic levels.

When synchronization signal S now goes momentarily to the 1 level once more, then output E of AND gate 176 goes to the 0 level, causing the output applied to NOR gate 188 from OR gate 184 to go to the 0 level. Output D of AND gate 178 goes to the 1 level, causing the output of OR gate 182 to go to the 1 level, so that signal K from set/reset flip-flop 187 goes to the 0 logic level. Output B of AND gate 170 therefore goes to the 0 logic level, so that signal CCMP goes to the 0 level. This causes output signal C from AND gate 174 to go to the 1 logic level, so that the output of OR gate 182 remains at the 1 level. Signal K therefore remains at the 0 level.

From the above description, it can be seen that the timing of the leading and trailing edges of the pulses of signal CCMP are determined by the timing of synchronizing signal S pulses, although signal CCMP is basically derived from signal $Q_P$. Any errors in the timing of logic level transitions of signal $Q_P$ are eliminated in signal CCMP, by means of synchronization with signal S and masking signal M.

FIG. 10B shows the waveforms of the synchronizing circuit 164 for a case in which the difference between the timing of each 0 level to 1 level transition of signal $Q_P$ differs from the timing of each S pulse by an amount which exceeds the predetermined range referred to previously.

In FIG. 10B, it is assumed that the degree of incorrect adjustment of the positions of the seconds hand and the minutes hand of the timepiece is such that the logic level transitions of signal $Q_P$ occur at points approximately midway between the S pulses. So long as the 0 level to 1 level transitions of signal $Q_P$ fall within the times at which signal M is at the 1 level, (i.e. within a range of ±20 seconds) then the operation of the circuit will be as described above, and illustrated by the waveforms of FIG. 10A. However if the timing of signal $Q_P$ is outside the permissible range, then synchronization circuit 164 enters a different mode of operation, as illustrated by the waveforms of FIG. 10B.

To facilitate understanding of the waveforms of FIG. 10B, numbers which indicate successive minutes of time are written on the diagrams of signal S, signal $Q_P$, and signal CCMP. The numbers written for signal S indicate 1 minute, 2 minutes, 3 minutes and 4 minutes, while the numbers written for signal $Q_P$ indicate 0 minutes, 1 minute, 2 minutes, and 3 minutes. This situation will occur if the minutes hand is positioned at a point midway between two minutes graduations of the timepiece dial when the seconds hand is at the 00 second position. As a result, signal CCMP has the form shown in FIG. 10B. As shown, more than one logic level transition of signal CCMP occurs during each one-minute interval, i.e. between each of the S signal pulses. As a result, the digital display which utilizes signals decoded from signals $G_A$ to $G_E$ shown in FIG. 6, will display minutes information in the order shown by the numbers on the CCMP waveforms, e.g. 2 minutes, 1 minute, 2 minutes, 1 minute, 2 minutes, 1 minute, 2 minutes, ... and so on. Such a time information display would be illogical, and must therefore be suppressed. This is performed in the present embodiment by means of the judgement circuit 162. This circuit acts to detect logical anomalies in the signals generated by synchronizing circuit 164, and to provide remedial measures.

The operation of judgement circuit 162 will now be described, with reference to FIG. 8 and to the waveform diagram of FIG. 10C. Flip-flops 210 and 220, in conjunction with OR gate 224, constitute a divide-by-2 counter, which counts the pulses of signal S and applies a short duration pulse to an input of OR gate 208 for every two pulses of signal S, i.e. once in every 2 minutes. Flip-flops 198, 200 and 202, in conjunction with AND gate 204, constitute a divide-by-5 counter, which is reset at 2 minute intervals by the output of OR gate 208, and which counts the pulses of signal T from AND gate 196. If five or more of the T pulses occur during a 2-minute interval between reset pulses applied to the divide-by-5 counter, then the output of AND gate 204 goes to the 1 logic level, thus causing a set/reset flip-flop 206 to be set, so that signal J, which is produced by this flip-flop, goes to the 1 logic level.

Signal T is produced by means of exclusive-OR gate 194 and the series-connected inverters 190 and 192 acting upon signal CCMP. Due to the delay to signal CCMP caused by passing through inverters 190 and 192, the logic levels of the two inputs of exclusive-OR gate 194 are momentarily different, each time a logic level transition of signal CCMP occurs. Thus, a short duration pulse is produced by exclusive-OR gate 194 each time a logic level transition of signal CCMP occurs, as shown in FIG. 10C, constituting signal T. When the timepiece is in the normal operating state, then signal U is at the 0 logic level, so that signal T is output by AND gate 196. Thus, if more than 4 logic level transitions of signal CCMP occur within the 2-minute interval between reset pulses applied to flip-flops 198, 200 and 202 of judgement circuit 162, control signal J goes to the 1 logic level, as described previously. This will only occur if the positions of the seconds and minutes hands are out of adjustment to such a degree that the 0 level to 1 level transitions of signal $Q_P$ occur at a time which is outside the permissible ±10 seconds range with respect to the mid-point of the M masking pulses.

It is possible to provide a warning indication to the user that the judgement circuit 116 has detected an anomalous condition as described above. This can be done by utilizing control signal J, such as by causing the seconds digit display to flash on and off repetitively, or to disappear, when signal J goes to the 1 logic level.

Synchronizing signal S can be formed as follows. A cam having a single notch cut in its periphery is mounted on shaft 36 (shown in FIG. 2) which carries the seconds hand of the timepiece. This shaft rotates by one revolution per minute. A contact spring, engages with the cam at one end, and is attached to plate 66, in electrical contact thereto, at the other end. A contact pin is fixed adjacent to the contact spring, insulated from plate 66, such as to come into contact with the contact spring each time the end of the contact spring enters the notch in the cam as the cam rotates. In this way, a voltage can be applied to the contact pin once per minute for a brief interval. The position of the cam is adjusted such that the voltage is applied to the contact pin only when the seconds hand reaches the 00 second position. The signal produced from the contact pin in this manner can then be processed by a circuit which provides a narrow positive-going pulse on the leading edge of that signal. The resultant train of narrow pulses constitutes synchronizing signal S.

FIG. 9 is a circuit diagram of the second timing signal generating circuit 176 shown in FIG. 7. The waveform diagram for the circuit of FIG. 9 is shown in FIG. 10D.

In FIGS. 9 and 10D, signal MM is the inverse of signal $G_D$ which is shown in FIG. 6. Signal MM is used as a masking signal, in a similar manner to signal M described with reference to FIG. 8 above. Signal MM consists of pulses having a duration of ±7 minutes with respect to a reference time point. This can be understood by referring to Table 1, in which it is shown that signal $G_D$ consists of a signal that is alternately at the 1 level and at the 0 level for 14 seconds at a time. SS denotes a second synchronizing signal, which is signal GM 0, consisting of the logical signal combination $(G_A \times G_B \times G_C \times G_D \times G_E)$ and consists of a train of positive-going pulses. Since signal GM 0 is based on signal CCMP, shown in FIGS. 6 and 8, second synchronizing signal SS is composed of pulses which are produced once in every 30 minutes, with a high degree of accuracy.

Signal $Q_{PP}$ shown in the circuit of FIG. 7, is applied to an input of AND gate 226 in second timing signal generating circuit 176. Masking signal MM is applied to AND gate 226 through an inverting input, and also to an input of an AND gate 228. When both masking signal MM and signal $Q_{PP}$ are at the 1 logic level, output signals a and b of AND gates 226 and 228 respectively, will be at the 0 logic level, so that output signal CCHPP from OR gate 230 is also at the 0 logic level. This is illustrated in FIG. 10D. At this time, output signal c of AND gate 236 is at the 1 logic level, due to the 0 level conditions of signals CCHPP and signal SS. As a result, the output of OR gate 244 is at the 1 logic level. This output is applied to an input of a NOR gate 248. NOR gate 248, in conjunction with a NOR gate 250 constitutes a set/reset flip-flop 251. The output of OR gate 246 is at the 0 level at this time, since outputs e, d and f of AND gates 238, 240 and 242 respectively are all at the 0 level. Thus, a 0 level input is applied to NOR gate 250 from OR gate 246. Output signal k of set/reset flip-flop 251 is therefore at the 0 level.

When masking signal MM goes to the 1 logic level, then output signal a of AND gate 226 remains at the 0 level. Since signal k is still at the 0 logic level, output b of AND gate 228 remains at the 0 logic level, so that signal CCHPP remains at the 0 level. Even if signal $Q_{PP}$ now goes to the 1 logic level, output signal CCHPP will remain at the 0 level, due to the 0 level output of AND gate 226 because of masking signal MM being at the the 1 logic level.

When second synchronizing signal SS goes to the 1 logic level momentarily, output signal c of AND gate 236 goes to the 0 level. Simultaneously, output signal f of AND gate 242 goes to the 1 logic level, thereby triggering set/reset flip-flop 176 to cause signal k to go to the 1 logic level. Output signal b of AND gate 228 therefore goes to the 1 logic level, causing signal CCHPP to also go to the 1 level. Output signal f of AND gate 242 therefore goes to the 0 logic level. Synchronizing signal SS now goes to the 0 logic level, so that output signal e of AND gate 240 goes to the 1 level. The output of OR gate 246 applied to NOR gate 250 therefore remains at the 1 logic level, so that output signal k of set/reset flip-flop 251 remains at the 1 logic level.

When masking signal MM now returns to the 0 logic level, then output signal b of AND gate 228 goes to the 0 logic level, while output signal a of AND gate 226 goes to the 1 logic level. As a result, output signal CCHPP from OR gate 230 remains held at the 1 logic level, while signals c, d, e, f and k all remain at their previous levels. When masking signal MM subsequently returns to the 1 logic level, then since both inputs of AND gate 228 are at the 1 logic level, so that output signal b is also at the 1 logic level, signal CCHPP remains at the 1 logic level, in spite of the fact that signal a from AND gate 226 goes to the 0 logic level. At this time, signals c, d, e, f and k all remain at their previous logic levels. In this condition, even when signal $Q_{PP}$ goes to the 0 logic level, there will be no change in output signal a of AND gate 226, which will remain at the 0 logic level, and no change in signal CCHPP.

When a pulse of signal SS now occurs, then output signal e of AND gate 238 goes to the 0 logic level. Simultaneously, output signal d of AND gate 240 goes to the 1 logic level, while inputs to NOR gates 248 and 250 of set/reset flip-flop 251 go to the 1 and 0 logic levels respectively. Output signal k therefore goes to the 0 logic level. Output signal b of AND gate 228 thus goes to the 0 level, causing signal CCHPP to go to the 0 logic level. Output signal d of AND gate 240 goes to the 0 logic level as a result of this. However, since output signal c of AND gate 236 goes to the 1 logic level when signal SS returns to the 0 logic level, a 1 level input continues to be applied to NOR gate 248.

FIG. 11 is a partial circuit diagram of code conversion circuit 26 shown in FIG. 1. Code conversion circuit 26 is composed of an AM/PM discrimination circuit 256 and a time data decoding circuit 276. Time data decoding circuit 276 includes a set of gates for converting signals $G_{AA}$, $G_{BB}$, $G_{CC}$, $G_{DD}$ and $G_{EE}$ into signals GH 0 to GH 23, and to convert signals $G_A$, $G_B$, $G_C$, $G_D$ and $G_E$ into signals GM 0 to GM 29, in the manner shown in Table 7 and Table 8 respectively.

TABLE 7

| SYMBOL | OUTPUT SIGNAL |
|---|---|
| GH 0  | $\overline{GAA} \times GBB \times GCC \times \overline{GDD} \times \overline{GEE}$ |
| GH 1  | $GAA \times GBB \times GCC \times \overline{GDD} \times \overline{GEE}$ |
| GH 2  | $GAA \times \overline{GBB} \times GCC \times \overline{GDD} \times \overline{GEE}$ |
| GH 3  | $\overline{GAA} \times \overline{GBB} \times GCC \times \overline{GDD} \times \overline{GEE}$ |
| GH 4  | $\overline{GAA} \times \overline{GBB} \times GCC \times GDD \times \overline{GEE}$ |
| GH 5  | $GAA \times \overline{GBB} \times GCC \times GDD \times \overline{GEE}$ |
| GH 6  | $GAA \times GBB \times GCC \times GDD \times \overline{GEE}$ |
| GH 7  | $\overline{GAA} \times GBB \times GCC \times GDD \times \overline{GEE}$ |
| GH 8  | $\overline{GAA} \times GBB \times \overline{GCC} \times GDD \times \overline{GEE}$ |
| GH 9  | $GAA \times GBB \times \overline{GCC} \times GDD \times \overline{GEE}$ |
| GH 10 | $GAA \times \overline{GBB} \times \overline{GCC} \times GDD \times \overline{GEE}$ |
| GH 11 | $\overline{GAA} \times \overline{GBB} \times \overline{GCC} \times GDD \times \overline{GEE}$ |
| GH 12 | $\overline{GAA} \times \overline{GBB} \times \overline{GCC} \times GDD \times GEE$ |
| GH 13 | $GAA \times \overline{GBB} \times \overline{GCC} \times GDD \times GEE$ |
| GH 14 | $GAA \times GBB \times \overline{GCC} \times GDD \times GEE$ |
| GH 15 | $\overline{GAA} \times GBB \times \overline{GCC} \times GDD \times GEE$ |
| GH 16 | $\overline{GAA} \times GBB \times GCC \times GDD \times GEE$ |
| GH 17 | $GAA \times GBB \times GCC \times GDD \times GEE$ |
| GH 18 | $GAA \times \overline{GBB} \times GCC \times GDD \times GEE$ |
| GH 19 | $\overline{GAA} \times \overline{GBB} \times GCC \times GDD \times GEE$ |
| GH 20 | $\overline{GAA} \times \overline{GBB} \times GCC \times \overline{GDD} \times GEE$ |
| GH 21 | $GAA \times \overline{GBB} \times GCC \times \overline{GDD} \times GEE$ |
| GH 22 | $GAA \times GBB \times GCC \times \overline{GDD} \times GEE$ |

TABLE 7-continued

| SYMBOL | OUTPUT SIGNAL |
|---|---|
| GH 23 | $\overline{GAA} \times GBB \times GCC \times \overline{GDD} \times GEE$ |

TABLE 8

| SYMBOL | OUTPUT SIGNAL |
|---|---|
| GM 0 | $GA \times \overline{GB} \times \overline{GC} \times \overline{GD} \times \overline{GE}$ |
| GM 1 | $GA \times GB \times \overline{GC} \times \overline{GD} \times \overline{GE}$ |
| GM 2 | $\overline{GA} \times GB \times \overline{GC} \times \overline{GD} \times \overline{GE}$ |
| GM 3 | $\overline{GA} \times GB \times GC \times \overline{GD} \times \overline{GE}$ |
| GM 4 | $GA \times GB \times GC \times \overline{GD} \times \overline{GE}$ |
| GM 5 | $GA \times \overline{GB} \times GC \times \overline{GD} \times \overline{GE}$ |
| GM 6 | $\overline{GA} \times \overline{GB} \times GC \times \overline{GD} \times \overline{GE}$ |
| GM 7 | $\overline{GA} \times \overline{GB} \times GC \times GD \times \overline{GE}$ |
| GM 8 | $GA \times \overline{GB} \times GC \times GD \times \overline{GE}$ |
| GM 9 | $GA \times GB \times GC \times GD \times \overline{GE}$ |
| GM 10 | $\overline{GA} \times GB \times GC \times GD \times \overline{GE}$ |
| GM 11 | $\overline{GA} \times GB \times \overline{GC} \times GD \times \overline{GE}$ |
| GM 12 | $GA \times GB \times \overline{GC} \times GD \times \overline{GE}$ |
| GM 13 | $GA \times \overline{GB} \times \overline{GC} \times GD \times \overline{GE}$ |
| GM 14 | $\overline{GA} \times \overline{GB} \times \overline{GC} \times GD \times \overline{GE}$ |
| GM 15 | $\overline{GA} \times \overline{GB} \times \overline{GC} \times GD \times GE$ |
| GM 16 | $GA \times \overline{GB} \times \overline{GC} \times GD \times GE$ |
| GM 17 | $GA \times GB \times \overline{GC} \times GD \times GE$ |
| GM 18 | $\overline{GA} \times GB \times \overline{GC} \times GD \times GE$ |
| GM 19 | $\overline{GA} \times GB \times GC \times GD \times GE$ |
| GM 20 | $GA \times GB \times GC \times GD \times GE$ |
| GM 21 | $GA \times \overline{GB} \times GC \times GD \times GE$ |
| GM 22 | $\overline{GA} \times \overline{GB} \times GC \times GD \times GE$ |
| GM 23 | $\overline{GA} \times \overline{GB} \times GC \times \overline{GD} \times GE$ |
| GM 24 | $GA \times \overline{GB} \times GC \times \overline{GD} \times GE$ |
| GM 25 | $GA \times GB \times GC \times \overline{GD} \times GE$ |
| GM 26 | $\overline{GA} \times GB \times GC \times \overline{GD} \times GE$ |
| GM 27 | $\overline{GA} \times GB \times \overline{GC} \times \overline{GD} \times GE$ |
| GM 28 | $GA \times GB \times \overline{GC} \times \overline{GD} \times GE$ |
| GM 29 | $GA \times \overline{GB} \times \overline{GC} \times \overline{GD} \times GE$ |

The gates which perform the latter conversions are not shown in FIG. 11.

Signals GH 0 and GH 1 are applied to inputs of an OR gate 278 in decoding circuit 276, the output of which is applied to inputs of AND gates 280 and 282. The output of AM/PM discrimination circuit 256 is applied to another input terminal of AND gate 280, and is also applied to an inverting input of AND gate 282. The output signal from AM/PM discrimination circuit 256 goes to the 1 level when an AM time is detected, and goes to the 0 level when a PM time is detected. When signal GH 0 or signal GH 1 is at the 1 logic level, therefore, an output at the 1 logic level is produced by AND gate 280 to indicate a time of 00 hours if the output of AM/PM discrimination circuit 256 is at the 1 logic level, while if the output of discrimination circuit 256 is at the 0 logic level, output signal 12 H of AND gate 282 goes to the 1 logic level, to indicate a time of 12 hours. While signal GH 2 or signal GH 3 is at the 1 logic level, an output is produced from OR gate 284 to indicate a time of 01 hours, i.e. one o'clock. In a similar way, the remaining OR gates in decoding circuit 276 which receive signals GH 4 to GH 23 produce output signals to indicate times of 02 hours to 11 hours, i.e. times from 2 o'clock to 11 o'clock. In this way, the code signals provided by the 24 sectors of second code dial 72 are converted into digital signals indicating 12 successive hours of time.

Each of signals GH 0, GH 2, GH 4, GH 6, ... to GH 22, is applied to an input of an OR gate 285. Output signal R from OR gate 285 goes to the 0 logic level to indicate the first half (i.e. from 0 to 29 minutes) of each hour of time indicated by signals 0 H to 12 H.

Signals GM 0 to GM 29 are applied, together with output signal R from OR gate 285, to inputs of a set of AND gates, as shown in FIG. 11, to produce a set of 60 output signals 0 M to 59 M respectively. These signals indicate times of 00 minutes to 59 minutes respectively. When, for example, signal GM 0 goes to the 1 logic level, then the output signal 0 M goes to the 1 logic level to indicate a time of 00 minutes, or output 30M goes to the 1 logic level to indicate a time of 30 minutes, depending upon whether signal R from OR gate 285 is at the 1 logic level or at the 0 logic level. In a similar way, when signal GM 1 goes to the 1 logic level, then either output signal 1 M, indicating a time of one minute, or signal 31M, indicating a time of 31 minutes, goes to the 1 logic level, in accordance with whether signal R is at the 1 or the 0 logic level. In this way, each of 60 signals, from 0 M to 59 M is produced from signals GM 0 to GM 29, together with signal R from OR gate 285. The code signals produced by means of the 30 sectors of first code disk 62 thereby serve to provide time information in the form of digital signals, for each minute in an hour of time.

The operation of AM/PM discrimination circuit 256 will now be described. Signals GH23 and GH 0 are applied to data inputs of data-type flip-flops 258 and 260 respectively. The Q output signal of flip-flop 258 is applied directly to one input of an exclusive-OR gate 262, and through a pair of series-connected inverters, 259 and 261, to another input of exclusive-OR gate 262. When a logic level transition of signal GH23 occurs, then a corresponding logic level transition occurs in the Q output of flip-flop 258, synchronized by clock pulse $\phi_{cl}$. Due to the delay caused by inverters 259 and 261, the two inputs to exclusive-OR gate 262 are momentarily at different logic levels, so that a positive-going pulse of very narrow width is produced by exclusive-OR gate 262, each time a logic level transition of signal GH23 occurs. In a similar way, a narrow pulse is produced by exclusive-OR gate 264 each time a logic level transition of signal GH 0 takes place. The outputs of exclusive-OR gates 262 and 264 are applied to inputs of an AND gate 266. When signal GH 23 goes from the 1 level to the 0 level, so that a pulse is produced by exclusive-OR gate 262, and signal GH 0 goes from the 0 level to the 1 level at the same time, then a pulse is output from AND gate 266. This occurs only at the transition from AM time to PM time. The output of AND gate 266 is applied to inputs of an AND gate 268 and of an AND gate 270. The output of AND gate 268 is applied to an input of a NOR gate 272. NOR gate 272, in conjunction with a second NOR gate 274 constitutes a set/reset flip-flop. The output of AND gate 270 is applied to an input of NOR gate 274. The output of NOR gate 272 is applied to a second input of AND gate 268, and to an inverting input of AND gate 270. It will be apparent that the output of NOR gate 272 will change between the 0 logic level and the 1 logic level in response to each successive output pulse from AND gate 266. In the present embodiment, AM time is indicated by the output of NOR gate 272 being at the 1 logic level, while PM time is indicated by the output of NOR gate 272 being at the 0 logic level.

A second embodiment of an analog-to-digital time data conversion system in accordance with the present invention will now be described. Referring first to FIG. 12, a partial view of the essential mechanical components of this second embodiment are shown therein, in cross-section. Numeral 302 denotes a cannon pinion, on which is mounted a minutes hand (not shown). Cannon pinion 302 is in frictional contact with a center wheel pinion 304. Cannon pinion 302, which has 16 teeth, also meshes with a minutes wheel pinion 314 which has 48 teeth. The speed of rotation of cannon pinion 302 is such that minutes wheel pinion 314 rotates through $\frac{1}{3}$ revolutions per hour. A first synchronization pinion 315 is mounted on, and attached to, the same shaft as minutes wheel 314, and rotates at the same speed. First synchronization pinion 315 has 12 teeth, and meshes with a first synchronization wheel 316 which has 48 teeth, so that first synchronization wheel 316 rotates through one revolution in 12 hours. A first coded disk 322 is mounted on a first synchronization shaft 318 and attached thereto, first synchronization wheel 316 also being mounted on and attached to first synchronization shaft 318. A surface of first coded disk 322 is divided into a number of conducting and non-conducting areas, and is in sliding contact with a set of contact springs 326, 328, 330, 332 and 334 which are mounted on an insulating support 324.

Minutes wheel 314 also meshes with a second synchronization pinion 338, which has 8 teeth. Second synchronization pinion 338 therefore rotates through one revolution in 30 minutes. A second coded disk 340 is attached to second synchronization pinion 338, and rotates at the same speed. Second coded disk 340 also has a number or conductive and non-conductive areas on a surface thereof, this surface being in sliding contact with a set of contact springs 344, 346, 348, 350 and 352 which are mounted on an insulating support 342.

FIG. 13A shows an arrangement of the pattern on first code disk 322 in which a binary code pattern is formed. As compared with the first embodiment of the present invention described previously, no auxiliary code track is formed on the disk. As shown, the surface of first coded disk 322 is divided into 30 sectors in a radial direction, and into five concentric tracks. As first coded disk 322 rotates, binary code signals representing hours information, from 00 to 24, is output from contact springs 326 to 334. Each of the binary code combinations thus produced represents a time period of $\frac{1}{2}$ hour, since first coded disk 322 rotates once in every 12 hours.

In FIG. 13B, second code disk 340 is also provided with a binary code pattern on its surface, and is divided into 30 sectors. Minutes time information from 00 minutes to 29 minutes is therefore output from contact springs 344 to 352 as second code disk 340 rotates.

By applying the code signals from contact springs 326 to 334 and 344 to 352 to a suitable decoder circuit, a set of signals corresponding to signals GM 0 to GM 29, and GH 0 to GH 23, as described for the first embodiment of the present invention, and shown in FIG. 11, can be produced. These signals can then be converted into digital signals indicating hours and minutes time information, by means of gate circuit such as those shown in FIG. 11.

FIG. 14A and FIG. 14B show alternative embodiments of first and second code disks 322 and 340 respectively in which a Gray code pattern is formed on each disk surface. The resulting code signals produced from contact springs 326 to 324 and 344 to 352 can be processed in a similar manner to that described for the first embodiment of the present invention, except for the fact that, since no auxiliary code track is provided on first and second code disks 322 and 340, the circuitry shown in FIGS. 6 and 7 for the first embodiment, which perform correction of the timing of the code signals, need not be provided.

The digital time signals produced by code conversion of the binary or Gray code signals of the second embodiment can be processed in various ways, as in the case of the first embodiment, e.g. by being applied to a display decoder/driver which drives an electro-optical display to provide a digital display of time information, or by being compared with the contents of a register in which present alarm time information is stored, in order to provide an alarm time coincidence detection signal. Since no means are provided for synchronizing the logic level transitions of the digital time signals produced by the second embodiment, the instant of transition from one minute of time to the next, as indicated by the seconds hand of the timepiece reaching the 00 second position, will usually differ from the instant of transition as indicated by the digital minutes display, for such reasons as backlash in the gear train, manufacturing tolerances, etc. Similarly, the instant of transition from one hour to the next, as indicated by the minutes hand of the timepiece reaching the 00 second position, will probably differ from the moment of transition as indicated by the hours digit display. A method of reducing this disparity is illustrated in block diagram form in FIG. 15. Numeral 355 denotes a code conversion circuit, which receives the digital code signals from contact springs 326 to 334 and 344 to 352, and produces digital time signals which are applied to a transfer circuit 357. Numeral 361 denotes a seconds counter which counts a time unit signal comprising a train of pulses at a frequency of 1 Hz. An output signal from seconds counter 361 having a frequency of one pulse per minute is applied to a minutes counter 363 and counter therein. An output signal from minutes counter 363 having a frequency of one pulse per hour is input to an hours counter 365 to be counted. When a transfer signal, which is produced periodically by the frequency divider means, e.g. once in every 24 hours, is applied to transfer circuit 357, then the digital time signals from code conversion circuit 355 are transferred to minutes counter 363 and to hours counter 365 and stored therein, replacing the previous contents of counters 363 and 365. The transfer signal may be produced, when an external operation member is actuated. It will be apparent that, if the transfer signal is applied at points in time which are intermediate between transitions of the digital code signals from code conversion circuit 355, then the time information which is stored in minutes counter 363 and hours counter 365 will be identical with the time information represented by the digital code signals, but that the precise moments of transition between increments of the contents of counters 363 and 365 will be determined by the output signal applied from seconds counter 361 to minutes counter 363 and from minutes counter 363 to hours counter 365. The operation of seconds counter 361 can be synchronized with the movement of the seconds hand of the timepiece by methods which are well known, such as by resetting the contents of seconds counter 361 to zero when the seconds hand of the timepiece is reset to the 12:00:00 position. Thus, the transitions of the time information provided by minutes counter 363 and hours counter 365 can be synchronized with the time indications of the seconds, minutes and hours hands of the timepiece, although the information which they provide is derived from first and second coded disks 322 and 340.

As stated previously, the first and second embodiments of the present invention are applicable to providing a digital display of time information in an electronic timepiece equipped with analog time display means. The digital and analog time information thus displayed will be maintained in coincidence even if the timepiece battery is replaced, and no special measures need be incorporated in order to ensure that both the analog and the digital time displays are altered by the same amount when the time indicated is corrected by the user through operation of an external actuating member. The coded disks can be of very small diameter, so that the present invention is applicable to electronic timepieces of small size and light weight. However it should be noted that the use of a digital display is not an essential feature of the present invention, and that the digital time signals which are produced can be processed electronically in various other ways.

It should also be noted that, although in the embodiments of the present invention described above, the first and second coded disks are divided into 24 sectors and 30 sectors respectively, various other numbers of sectors can be utilized. It is for example possible to utilize a first coded disk divided into 12 sectors and second coded disk divided into 60 sectors, whereby each sector of the first coded disk represents a period of one hour and each sector of the second coded disk represents one minute. It is also possible to provide a coded disk having 720 sectors, with the disk being rotated through one revolution in 12 hours, so that each sector represents one minute. Another arrangement is to have a first coded disk divided into 60 sectors and a second disk divided into 24 sectors. Yet another possible arrangement is to have a single coded disk which rotates through one revolution in 24 hours and which is provided with 1440 sectors, so that each sector represents one minute.

It should moreover be noted that, although in the described embodiments of the present invention, the coded disks are coded by means of a pattern of conducting and non-conducting areas on their surfaces, this is not a necessary feature of the present invention. It is possible, for example, to provide a pattern of areas which are opaque and transparent to light, or which are reflective and non-reflective, and to arrange a light source (such as light-emitting diodes) and photo-electric elements in relation to the coded disks such that light is applied to or cut off from the photoelectric elements as the coded disk rotates, in accordance with the code pattern. Such a system has the advantage that physical contact does not take place between fixed elements and the coded disks, so that wear will not occur.

In addition, although the judgement circuit of the first embodiment of the present invention serves to detect whether five or more logic level transitions of signal CCMP occur within two minutes, and produces a control signal when such a number of transitions is detected, this number of logic level transitions can be other than five, since it is only necessary to detect whether more than one logic level transition of signal CCMP occurs within one minute.

As stated previously, an indication can be given to the user that the judgement circuit has produced a control signal, by causing the seconds digit display to disappear or to flash on and off. However it is also possible to provide a warning indication in this case by sounding the alarm buzzer of the timepiece, if such a buzzer is equipped.

It should also be noted that the first coded disk 62 in the first embodiment of the present invention is positioned at a point in the turning effort transmission path of the wheel train which is between the winding stem 64 and the center wheel 38. This is an important feature, in reducing the effects of backlash in the wheel train upon the time information which is detected by means of first code disk 62. Such backlash can cause errors in the phase of the minutes information detected by means of first code disk 62.

Although the present invention has been shown and described with respect to specific embodiments, various changes and modifications of these embodiments are possible, which come within the scope claimed for the present invention.

What is claimed is:

1. An analog-to-digital time data conversion system for an electronic timepiece having a source of a standard time signal, frequency divider circuit means for dividing the frequency of said standard time signal to provide a time unit signal, driver circuit means responsive to said time unit signal for producing a drive signal, electro-mechanical transducing means driven by said drive signal, a wheel train driven by said electro-mechanical transducing means for reducing the speed of movement and transmitting the mechanical displacement of said electro-mechanical transducing means, and analog time indicating means driven by said wheel train for indicating time information, comprising:

at least one coded disk coupled to said wheel train for being rotated thereby, said coded disk including a plurality of areas mutually differentiated to represent the bits of a multiple-bit digital code, adjacent groups of said areas representing code combinations of said multiple-bit digital code, and each of said code combinations representing a point in time indicated by said analog time indicating means;

means for successively detecting said code combinations as said coded disk rotates, said detection means providing a plurality of digital code signals and a transition signal;

code processing circuit means responsive to said transition signal for correcting the timing of logic level transitions of said digital code signals, to produce corrected digital code signals; and code convertion means responsive to said corrected digital code signals for producing digital time data signals indicative of said time information.

2. An electronic timepiece according to claim 1, wherein said plurality of areas mutually differentiated to represent the bits of a multi-bit digital code comprise electrically conductive and non-conductive areas of a surface of said coded disk, and wherein said means for successively detecting said code combinations comprises a plurality of electrical contact members being in sliding contact with said surface of said coded disk.

3. An electronic timepiece according to claim 1, wherein said plurality of areas of said coded disk comprise a plurality of concentric tracks, and a plurality of sectors of equal angular displacement, each of said tracks being coded to represent one bit of said multi-bit digital code.

4. An electronic timepiece according to claim 1, wherein said multi-bit digital code is a Gray code.

5. An electronic timepiece according to claim 4, and further comprising at least one auxiliary track on said coded disk, said auxiliary track representing an auxiliary code, and wherein said detection means detects said auxiliary code for providing said transition signal comprising an auxiliary code signal undergoing a transition between a first logic level potential and a second logic level potential at each transition between adjacent combinations of said Gray code.

6. An electronic timepiece according to claim 5, and further comprising a source of a synchronizing signal, the timing of said synchronizing signal being synchronized with a specific point in time of said time information indicated by said analog time indicating means, and furthermore comprising timing signal generating circuit means responsive to said auxiliary code signal and said synchronizing signal for producing a synchronized timing signal, said code processing circuit means being responsive to said synchronized timing signal for correcting the timing of logic level transitions of said digital code signals to produce synchronized digital code signals, whereby a logic level transition of said synchronized digital code signals is synchronized with said specific point in time of said time information indicated by said analog time indicating means.

7. An electronic timepiece according to claim 6, wherein said time unit signal comprises a train of pulses having a frequency of one Hz, and further comprising a seconds counter circuit means for counting said time unit signal and for producing a one-minute pulse each time sixty of said pulses of said time unit signal have been counted, and for further producing a masking signal comprising a train of pulses, whereby each of said masking pulses is initiated a fixed number of seconds prior to one of said one-minute pulses and is terminated when an equal number of seconds have elapsed following one of said one-minute pulses.

8. An electronic timepiece according to claim 7, wherein said timing signal generating means is responsive to said masking signal and to said auxiliary code signal for detecting that the difference between the timing of a logic level transition of said auxiliary code signal and a logic level transition of said masking signal exceeds a predetermined value, and for causing a change in the repetition rate of pulses comprising said synchronizing signal when said detection occurs.

9. An electronic timepiece according to claim 8, and further comprising judgement circuit means for detecting said change in repetition rate of said synchronizing signal when said difference between the timing of a logic level transition of said auxiliary code signal and a logic level transition of said masking signal exceeds said predetermined value, and for producing a control signal in response to said detection, said timing signal generation circuit means being responsive to said control signal for applying said auxiliary code signal directly to said code processing circuit means to correct the timing of said digital code signals.

10. An electronic timepiece according to claim 6, wherein said electronic timepiece further comprises a solid plate for partially supporting said wheel train, and wherein said analog time indicating means comprises an hours hand, a minutes hand and a seconds hand, and a shaft fixed to said seconds hand and coupled to said wheel train, and wherein said source of a synchronizing signal comprises:

a cam mounted on said shaft and having a notched portion on the periphery thereof, said notched portion being aligned parallel to the axis of said shaft;
a contact spring fixed to said solid plate at one end thereof and in sliding contact with the periphery of said cam at the other end thereof;
a contact pin fixed to said solid plate adjacent to said contact spring; and
a voltage source having one terminal coupled to said contact spring.

11. An electronic timepiece according to claim 1, and further comprising an AM/PM time discrimination circuit responsive to said digital time data signals for discriminating between AM time and PM time, and for producing signals indicative that said time information is AM time and PM time.

12. An electronic timepiece according to claim 1, wherein said at least one coded disks comprises a plurality of coded disks coupled to said wheel train to be rotated at different speeds of rotation with respect to one another.

13. An electronic timepiece according to claim 12, wherein said digital time data signals comprise a first set of digital time data signals for indicating time information from 00 minutes to 59 minutes and a second set of time data signals for indicating time information from 00 hours to 12 hours.

14. An electronic timepiece according to claim 1, and further comprising display decoder and display driver circuit means and electro-optical display means, said display decoder and display driver circuit means being responsive to said digital time data signals for producing display drive signals, said display drive signals being applied to said electro-optical display means for displaying said time information in digital form.

15. An electronic timepiece according to claim 1, wherein said analog time indicating means comprises a minutes hand, a minutes wheel and pinnion coupled to said minutes hand, a center wheel and pinion coupled to said minutes wheel and pinion, and a winding stem, and wherein said coded disk is coupled to said winding stem for being rotated thereby, and furthermore comprising gear wheel means fixedly attached to said coded disk and coupled to said center wheel and pinion, whereby said center wheel and pinion is rotated by rotation of said coded disk.

16. An analog-to-digital time data conversion system for an electronic timepiece comprising a source of a standard time signal, frequency divider circuit means for dividing the frequency of said standard time signal to provide a time unit signal including a pulse train having a frequency of 1 Hz and a periodical transfer signal, driver circuit means responsive to said time unit signal for producing a drive signal, electro-mechanical transducing means driven by said drive signal, a wheel train driven by said electro-mechanical transducing means for reducing the speed of movement and transmitting the mechanical displacement of said electro-mechanical transducing means, and analog time indicating means driven by said wheel train for indicating time information, comprising:

at least one coded disk coupled to said wheel train for being rotated thereby, said coded disk including a plurality of areas mutually differentiated to represent the bits of a multiple-bit digital code, adjacent groups of said areas representing code combinations of said multi-bit digital code, and each of said code combinations representing a point in time indicated by said analog time indicating means;

means for successively detecting said code combinations as said coded disk rotates, said detection means providing a plurality of digital code signals;

code conversion means responsive to said digital code signals for producing digital time data signals indicative of said time information, said time data signals comprising a first set of digital time data signals for indicating minutes information and a second set of digital time data signals for indicating hours information;

transfer circuit means coupled to receive said transfer signal, and said first and second digital time data signals;

a seconds counter circuit for counting said time unit signal and for producing an output signal when sixty pulses of said time unit signal have been counted;

a minutes counter circuit coupled to receive said output signal from said seconds counter circuit and for producing an output signal when sixty pulses of said output signal from said seconds counter circuit have been counted; and an hours counter coupled to receive said output signal from said minutes counter circuit;

said minutes counter and said hours counter being coupled to output terminals of said transfer circuit means, whereby a count held in said minutes counter and a count held in said hours counter circuit are respectively replaced by a numeric value represented by said first set of digital time data signals and by a numeric value represented by said second set of digital time data signals when said transfer signal is generated.

* * * * *